US009685206B2

(12) United States Patent
Choi et al.

(10) Patent No.: US 9,685,206 B2
(45) Date of Patent: Jun. 20, 2017

(54) MEMORY DEVICE, MEMORY SYSTEM, AND METHOD OF CONTROLLING READ VOLTAGE OF THE MEMORY DEVICE

(71) Applicants: Myung-Hoon Choi, Suwon-si (KR); Jae-Yong Jeong, Yongin-si (KR); Ki-Tae Park, Seongnam-si (KR)

(72) Inventors: Myung-Hoon Choi, Suwon-si (KR); Jae-Yong Jeong, Yongin-si (KR); Ki-Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 224 days.

(21) Appl. No.: 13/948,557

(22) Filed: Jul. 23, 2013

(65) Prior Publication Data

US 2015/0029796 A1    Jan. 29, 2015

(30) Foreign Application Priority Data

Jul. 23, 2012    (KR) .................. 10-2012-0080247

(51) Int. Cl.
  *G11C 7/10*    (2006.01)
  *G11C 16/26*    (2006.01)
  (Continued)

(52) U.S. Cl.
  CPC ........ *G11C 7/1057* (2013.01); *G11C 11/5642* (2013.01); *G11C 16/0483* (2013.01);
  (Continued)

(58) Field of Classification Search
  CPC . G11C 7/1057; G11C 29/028; G11C 16/0483; G11C 16/26; G11C 29/021;
  (Continued)

(56) References Cited

U.S. PATENT DOCUMENTS 6,275,346 B1    8/2001    Kim et al.
7,843,723 B2    11/2010    Shibata
(Continued)

FOREIGN PATENT DOCUMENTS

CN    101246418 A    8/2008
CN    102318008 A    1/2012
(Continued)

OTHER PUBLICATIONS

Search Report Dated Mar. 18, 2015.
(Continued)

*Primary Examiner* — Jasmine Song
(74) *Attorney, Agent, or Firm* — Volentine & Whitt, PLLC

(57) ABSTRACT

A memory device includes a memory cell array having a plurality of memory cells, and a page buffer unit including a plurality of page buffers configured to store a plurality of pieces of data sequentially read from some of the plurality of memory cells at different read voltage levels, respectively, and to perform a logic operation on the plurality of pieces of data, respectively. The memory device further includes a counting unit configured to count the number of memory cells that exist in each of a plurality of sections defined by the different read voltage levels, based on results of the logic operation.

28 Claims, 24 Drawing Sheets

(51) Int. Cl.
*G11C 11/56* (2006.01)
*G11C 16/04* (2006.01)
*G11C 16/34* (2006.01)
*G11C 29/44* (2006.01)
*G11C 29/02* (2006.01)
*G11C 16/00* (2006.01)

(52) U.S. Cl.
CPC .......... *G11C 16/26* (2013.01); *G11C 16/3431* (2013.01); *G11C 29/021* (2013.01); *G11C 29/028* (2013.01); *G11C 29/44* (2013.01); *G11C 16/00* (2013.01)

(58) Field of Classification Search
CPC ..... G11C 11/5642; G11C 29/44; G11C 16/00; G11C 16/3431
USPC .............. 711/100, 131; 365/185.03, 185.08, 365/189.05, 189.09
See application file for complete search history.

(56) References Cited

U.S. PATENT DOCUMENTS

| | | | |
|---|---|---|---|
| 7,859,917 | B2 | 12/2010 | Chen et al. |
| 7,936,601 | B2 | 5/2011 | Kang et al. |
| 7,937,058 | B2 | 5/2011 | Rahman et al. |
| 7,954,037 | B2 | 5/2011 | Lasser et al. |
| 8,027,194 | B2 | 9/2011 | Lee et al. |
| 8,073,648 | B2 | 12/2011 | Shlick et al. |
| 8,139,425 | B2 | 3/2012 | Chen et al. |
| 8,169,812 | B2 | 5/2012 | Lynch |
| 8,358,542 | B2 | 1/2013 | Radke et al. |
| 8,565,022 | B2 * | 10/2013 | Shin et al. ............... 365/185.03 |
| 8,625,355 | B2 | 1/2014 | Chokan et al. |
| 8,659,966 | B2 | 2/2014 | Choi et al. |
| 8,797,803 | B2 | 8/2014 | Radke et al. |
| 2003/0080717 | A1 | 5/2003 | Kajimoto |
| 2003/0156462 | A1 | 8/2003 | Lim et al. |
| 2008/0094914 | A1 | 4/2008 | Park et al. |
| 2008/0205136 | A1 | 8/2008 | Wang et al. |
| 2008/0313387 | A1 | 12/2008 | Shibata |
| 2009/0003057 | A1 | 1/2009 | Kang et al. |
| 2009/0164871 | A1 | 6/2009 | Jo |
| 2009/0292972 | A1 | 11/2009 | Seol et al. |
| 2009/0327803 | A1 | 12/2009 | Fukutomi et al. |
| 2010/0172191 | A1 | 7/2010 | Chen et al. |
| 2010/0199138 | A1 * | 8/2010 | Rho ....................... G11C 16/26 714/746 |
| 2010/0296350 | A1 | 11/2010 | Kim et al. |
| 2010/0318839 | A1 | 12/2010 | Avila et al. |
| 2011/0191649 | A1 | 8/2011 | Lim et al. |
| 2012/0134213 | A1 | 5/2012 | Choi et al. |
| 2012/0155186 | A1 | 6/2012 | Chokan et al. |
| 2012/0182810 | A1 | 7/2012 | Radke et al. |
| 2014/0355355 | A1 | 12/2014 | Radke et al. |

FOREIGN PATENT DOCUMENTS

| | | |
|---|---|---|
| EP | 1993101 A2 | 11/2008 |
| JP | 2008-34065 A | 2/2008 |
| JP | 2008204591 | 9/2008 |
| JP | 2009-16028 A | 1/2009 |
| JP | 2009151919 | 7/2009 |
| JP | 2009301264 | 12/2009 |
| JP | 2010015195 | 1/2010 |
| JP | 2012-113810 A | 6/2012 |
| KR | 2008-0035828 A | 4/2008 |
| KR | 20090122060 A | 11/2009 |
| KR | 20090129624 A | 12/2009 |
| KR | 20110089728 A | 8/2011 |

OTHER PUBLICATIONS

Chinese Office Action in Related Chinese Application No. 201310311596.2 Dated Dec. 28, 2016.
Japanese Office Action in Related Japanese Application No. 2013-151422 Dated Mar. 17, 2017.

* cited by examiner

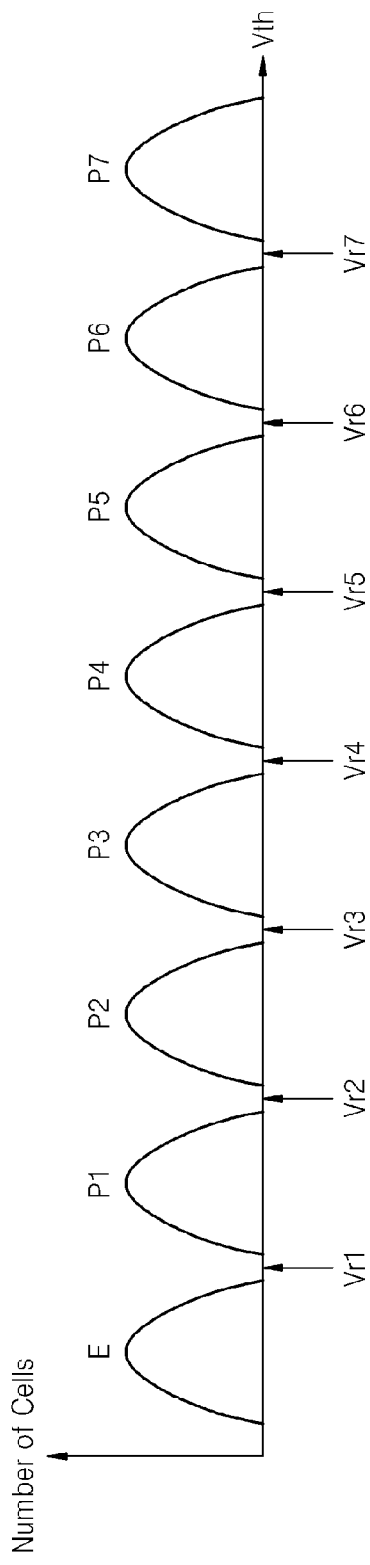
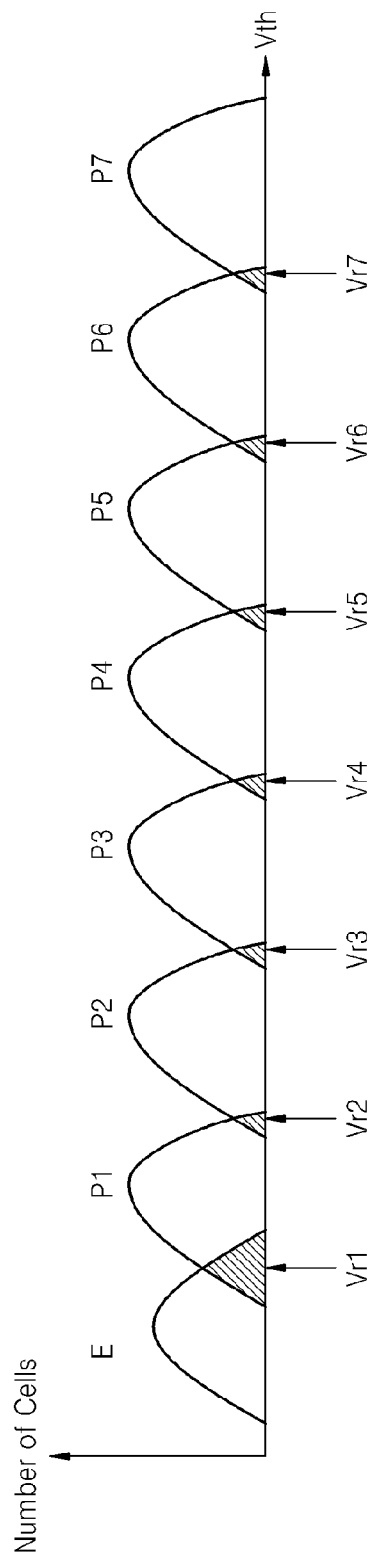

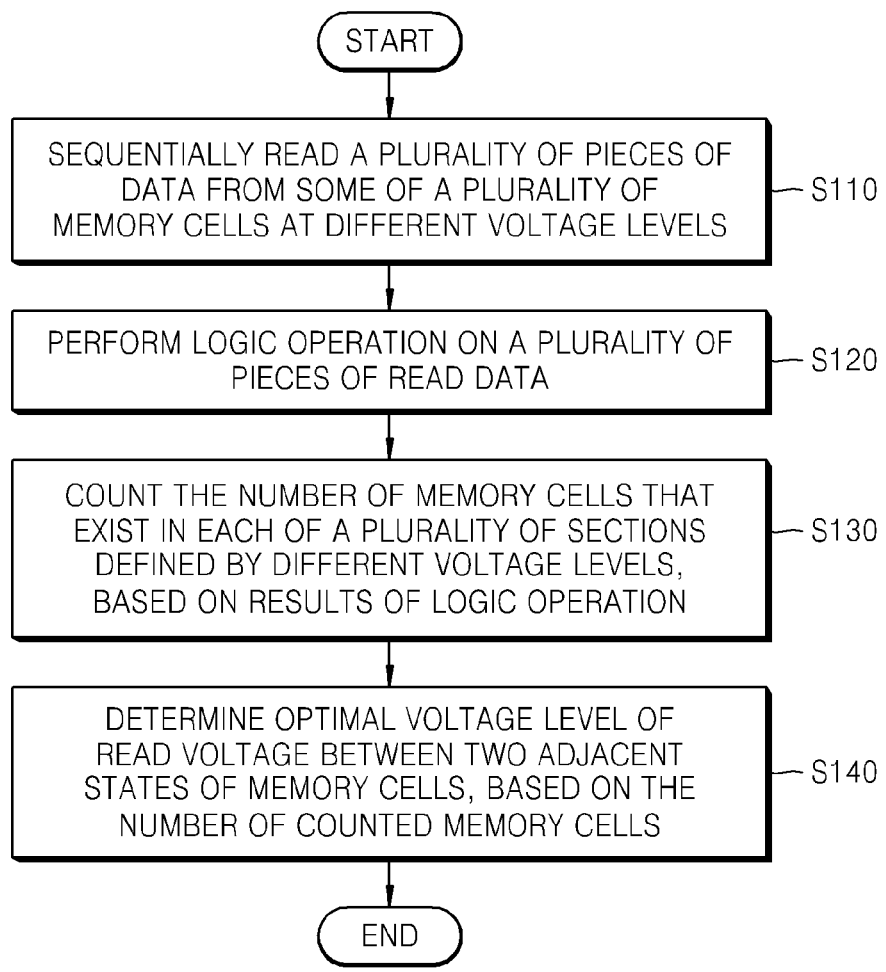

MEMORY DEVICE, MEMORY SYSTEM, AND METHOD OF CONTROLLING READ VOLTAGE OF THE MEMORY DEVICE

CROSS-REFERENCE TO RELATED APPLICATIONS

A claim of priority is made to Korean Patent Application No. 10-2012-0080247, filed on Jul. 23, 2012, in the Korean Intellectual Property Office, the disclosure of which is incorporated herein in its entirety by reference.

BACKGROUND

The inventive concept generally relates to memory devices, and more particularly, to a memory device, a memory system, and a method of controlling a read voltage of the memory device.

The volatile memory devices are characterized by the loss of stored contents at a power-off condition. Examples of volatile memory devices include certain types of random access memory (RAM) such as a static RAM (SRAM), a dynamic RAM (DRAM), a synchronous DRAM (SDRAM), and the like. In contrast, nonvolatile memory devices are characterized by the retention of stored contents even during power-off condition. Examples of nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

SUMMARY

According to an aspect of the inventive concept, there is provided a memory device including a memory cell array comprising a plurality of memory cells; a page buffer unit comprising a plurality of page buffers configured to store a plurality of pieces of data sequentially read from some of the plurality of memory cells at different read voltage levels, respectively, and to perform a logic operation on the plurality of pieces of data, respectively; and a counting unit configured to count the number of memory cells that exist in each of a plurality of sections defined by the different read voltage levels, based on results of the logic operation.

Each of the plurality of page buffers may perform an XOR operation on two pieces of data which are respectively read at two read voltage levels that are adjacent to each other from among the different read voltage levels, and the counting unit may count the number of '1' outcomes from a result of the XOR operation with respect to each of the plurality of sections.

The plurality of memory cells may be disposed in areas in which a plurality of wordlines and a plurality of bitlines cross one another, and the number of the plurality of page buffers may correspond to the number of the plurality of bitlines.

The counting unit may include counters corresponding to the number of sectors or pages of the memory cell array on which a read operation is performed.

The different read voltage levels may be automatically updated in the memory device.

The memory device may further include a voltage level determining unit that determines the different read voltage levels applied to the memory cell array.

The voltage level determining unit may include a start voltage storage unit storing a start read voltage that is applied to the memory cell array; an offset storage unit storing a plurality of offset voltages that are pre-defined; and an adding unit adding one of the plurality of offset voltages to the start read voltage.

The start voltage storage unit may store a digital value of the start read voltage, the offset storage unit may store digital values of the plurality of offset voltages, and the voltage level determining unit may further include a voltage level generating unit that generates an analog voltage level from an output from the adding unit.

The start read voltage may be determined to vary with respect to different memory chips. The plurality of offset voltages may be determined to be the same with respect to different memory chips.

The memory device may further include a valley detecting unit detecting a voltage level that corresponds to a valley between two adjacent states of the memory cells based on the number of the memory cells counted by the counting unit.

The valley detecting unit may include a minimum value storage unit that stores a minimum value of the numbers of the memory cells that exist in each of the plurality of sections; and a minimum offset storage unit that stores an offset as a minimum offset, wherein the offset corresponds to a section that is from among the plurality of sections and that has the minimum value. The valley detecting unit may further include a valley storage unit that stores a voltage level corresponding to the valley based on the minimum offset stored in the minimum offset storage unit.

The valley storage unit may include a plurality of valley storage devices, and the number of the plurality of valley storage devices may correspond to the number of valleys between the two adjacent states of the memory cells.

Each of the memory cells may be an n-bit memory cell, the valley storage unit may include a plurality of valley storage devices, and the number of the plurality of valley storages may be $2^n-1$.

The memory device may further include a read voltage generating unit that provides the memory cell array with a voltage level as a read voltage, which corresponds to the valley detected by the valley detecting unit.

The read voltage generating unit may include an initial read voltage storage unit storing a plurality of initial read voltages that respectively correspond to valleys between two adjacent states from among a plurality of states of the memory cells; an offset storage unit storing a plurality of offsets that correspond to the valleys, respectively; and an adding unit adding one of the plurality of offsets to one of the plurality of initial read voltages.

The read voltage generating unit may further include a first control unit that controls the initial read voltage storage unit to select one of the plurality of initial read voltages stored in the initial read voltage storage unit; and a second control unit that controls the offset storage unit to use one of the plurality of offsets stored in the offset storage unit so as to generate a read voltage.

The initial read voltage storage unit may store digital values of the plurality of initial read voltages, the offset storage unit may store digital values of the plurality of offsets, and the read voltage generating unit may further include a voltage level generating unit that generates an analog voltage level from an output from the adding unit.

The memory device may further include a pre-charge determining unit that determines whether or not to pre-charge at least one bitline connected to at least one memory cell from among the plurality of memory cells. The at least one memory cell may be a memory cell of which read voltage is already determined or may be a memory cell of which read voltage is not required to be detected.

The memory device may further include a sampling unit controlling the page buffer unit to perform sampling on at least one memory cell that is from among the plurality of memory cells and that performs an operation to determine a read voltage.

According to another aspect of the inventive concept, a memory device is provided which includes a memory cell array comprising a plurality of bit lines and word lines, and a plurality of memory cells located at intersections of the bit lines and word lines, each of the memory cells programmable between at least 2 threshold states; a read voltage generator configured to apply a read voltage to selected word lines of the memory cell array; a page buffer unit comprising a plurality of page buffers respectively connected to the bit lines of the memory cell array; a counter; and a logic circuit configured to execute a minimal error search (MES) operation. The MES operation including controlling the read voltage generator to sequentially apply different read voltages to the selected word lines, controlling the page buffers to perform logic operations on respective read results corresponding to at least two of the sequentially applied different read voltages, and controlling the counter to count results of the logic operation, wherein the different read voltages are in a vicinity between adjacent threshold voltages of adjacent threshold states, and wherein the count results are indicative of a read voltage resulting in minimal read error between the adjacent threshold states.

According to another aspect of the inventive concept, there is provided a memory system including a memory device and a memory controller for controlling the memory device, wherein the memory device includes a memory cell array comprising a plurality of memory cells; a page buffer unit comprising a plurality of page buffers configured to store a plurality of pieces of data sequentially read from some of the plurality of memory cells at different read voltage levels, respectively, and to perform a logic operation on the plurality of pieces of data, respectively; and a counting unit configured to count the number of memory cells that exist in each of a plurality of sections defined by the different read voltage levels, based on results of the logic operation.

The memory device may provide the memory controller with the number of the counted memory cells.

The memory device may further include a voltage level determining unit that determines the different voltage levels applied to the memory cell array.

The memory device may further include a valley detecting unit detecting a voltage level that corresponds to a valley between two adjacent states of the memory cells based on the number of the memory cells counted by the counting unit, and the memory device provides the memory controller with a voltage level corresponding to the detected valley.

According to another aspect of the inventive concept, there is provided a memory system comprising a memory device and a memory controller for controlling the memory device, wherein the memory device includes a memory cell array comprising a plurality of memory cells; a page buffer unit comprising a plurality of page buffers configured to store a plurality of pieces of data sequentially read from some of the plurality of memory cells at different read voltage levels, respectively, and to perform a logic operation on the plurality of pieces of data, respectively; a counting unit configured to count the number of memory cells that exist in each of a plurality of sections defined by the different read voltage levels, based on results of the logic operation: and a read voltage generating unit configured to determine a voltage level as a read voltage which corresponds to a valley between two adjacent states of the memory cells based on the number of the counted memory cells, and providing the read voltage to the memory cell array.

According to another aspect of the inventive concept, a method of controlling a read voltage of a memory device is provided, the memory device configured to operate under control of a memory controller, the method including sequentially reading, in the memory device, a plurality of pieces of data from some of a plurality of memory cells of the memory device at different voltage levels; performing, in the memory device, a logic operation on the plurality of pieces of data; counting, in the memory device, the number of memory cells that exist in each of a plurality of sections defined by the different voltage levels, based on results of the logic operation; and determining, in the memory device, an optimal voltage level of a read voltage between two adjacent states of the memory cells, based on the number of the counted memory cells.

BRIEF DESCRIPTION OF THE DRAWINGS

Exemplary embodiments of the inventive concept will be more clearly understood from the detailed description at follows taken in conjunction with the accompanying drawings, in which:

FIG. 6A is a graph illustrating threshold voltage distributions of the memory device of FIG. 2 when the memory cell of FIG. 5 is a 3-bit multi-level cell;

FIG. 6B is a graph illustrating a case in which the threshold voltage distributions illustrated in FIG. 6A have varied;

FIG. 32 is a flowchart illustrating a method of controlling a read voltage, performed by a memory device, according to an embodiment of the inventive concept.

DETAILED DESCRIPTION OF THE EMBODIMENTS

Figure 1:
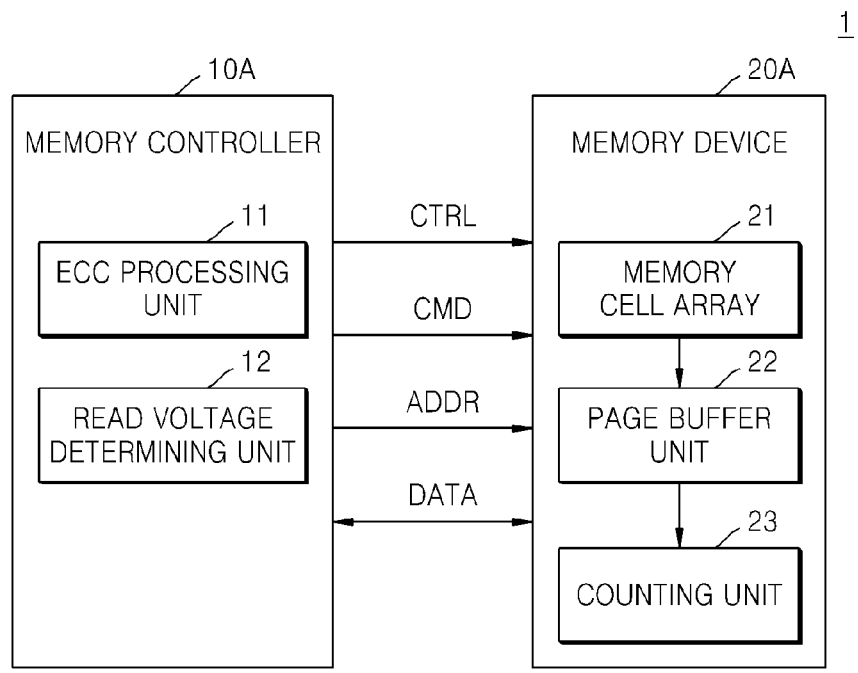
FIG. 1 is a block diagram of a memory system according to an embodiment of the inventive concept.

As used herein, the term "and/or" includes any and all combinations of one or more of the associated listed items.

The attached drawings for illustrating exemplary embodiments of the inventive concept are referred to in order to gain a sufficient understanding of the inventive concept, the merits thereof, and the objectives accomplished by the implementation of the inventive concept. The inventive concept may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals refer to like elements. Furthermore, various elements and regions in the drawings are schematically shown. Thus, the inventive concept is not limited by a relative size or distance in the attached drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms 'first', 'second', 'third' etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiment.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of a memory system 1 according to an embodiment of the inventive concept.

Referring to FIG. 1, the memory system 1 may include a memory controller 10A and a memory device 20A. The memory device 20A may include a memory cell array 21, a page buffer unit 22, and a counting unit 23. The memory controller 10A may include an error correction code (ECC) processing unit 11 and a read voltage determining unit 12. Hereinafter, elements included in the memory controller 10A and the memory device 20A will be described in detail.

The memory controller 10A may perform a control operation with respect to the memory device 20A. More particularly, the memory controller 10A may provide address signals ADDR, command signals CMD, and control signals CTRL to the memory device 20A, to thereby control program (or write) operations, read operations, and erasing operations with respect to the memory device 20A. Further, write and read data DATA may be transmitted between the memory controller 10A and memory device 20A.

The memory cell array 21 may include a plurality of memory cells (not shown) that are disposed in areas in which a plurality of wordlines (not shown) and a plurality of bitlines (not shown) cross one another. In one embodiment, the plurality of memory cells may be flash memory cells, and the memory cell array 21 may be a NAND flash memory cell array or a NOR flash memory cell array. Hereinafter, embodiments of the inventive concept will be described using the example in which the plurality of memory cells are flash memory cells. However, aspects of the inventive concept are not limited thereto, and in other embodiments, the plurality of memory cells may be memory cells other types of variable resistive memory, such as a resistive random access memory (RRAM), a phase change RAM (PRAM), or a magnetic RAM (MRAM).

The page buffer unit 22 may temporarily store data to be written to the memory cell array 21, or data read from the memory cell array 21. In the present embodiment, the page buffer unit 22 may include a plurality of page buffers (not shown), and the number of page buffers may correspond to the number bitlines.

In more detail, when a read operation with respect to the memory device 20A is performed, the plurality of page buffers may respectively store a plurality of pieces of data which are sequentially read from some of the plurality of memory cells at different voltage levels, and may respectively perform logic operations on the plurality of pieces of stored data. In the present embodiment, each of the plurality of page buffers may perform an XOR operation on two pieces of data which are respectively read at two voltage levels that are adjacent to each other from among the different voltage levels.

In one embodiment, the different voltage levels may be automatically updated in the memory device 20A. Accordingly, it is not required to perform a data exchange between the memory controller 10A and the memory device 20A so as to set the different voltage levels. However, embodiments of the inventive concept are not limited thereto, and in another embodiment, the different voltage levels may be supplied from the memory controller 10A.

According to a result of the logic operations performed by the page buffer unit 22, the counting unit 23 may count the number of the memory cells that exist in each of a plurality of sections defined by the different voltage levels. Here, the counting unit 23 may be integrated into the same chip as the memory cell array 21 and the page buffer unit 22. In the present embodiment, the counting unit 23 may count the number of '1' outcomes from the result of the XOR operation with respect to each of the plurality of sections.

As described above, the memory device 20A includes the counting unit 23, so that, when a read voltage determining operation is performed to determine an optimal voltage level of the read voltage with respect to the memory device 20A, the memory device 20A may not provide the plurality of pieces of data read from the memory cell array 21 to the memory controller 10A, but instead may directly count the number of the memory cells that exist in each of the plurality of sections. By doing so, a time elapsed in the performance of a read voltage determining operation with respect to the memory device 20A may be decreased.

The ECC processing unit 11 may check whether an error (i.e., a read error) exists in the data read from the memory device 20A and may correct the read error. For example, the ECC processing unit 11 may compare a parity that is generated and stored when the data is programmed with a parity that is generated when the data is read, may detect an error bit of the data based on a comparison result, and may perform an XOR operation on the detected error bit so as to correct the read error. Accordingly, although the data is read from a memory cell included in the memory cell array 21 at an initial read voltage and then the ECC processing unit 11 corrects the read error, when a read failure occurs, the counting unit 23 may perform a counting operation.

The read voltage determining unit 12 may receive a counting result from the counting unit 23, and may determine an optimal voltage level of the read voltage based on the counting result. In more detail, when the number of the memory cells that exist in each of the plurality of sections decreases and then increases, the read voltage determining unit 12 may determine a corresponding point as the read voltage.

Figure 2:
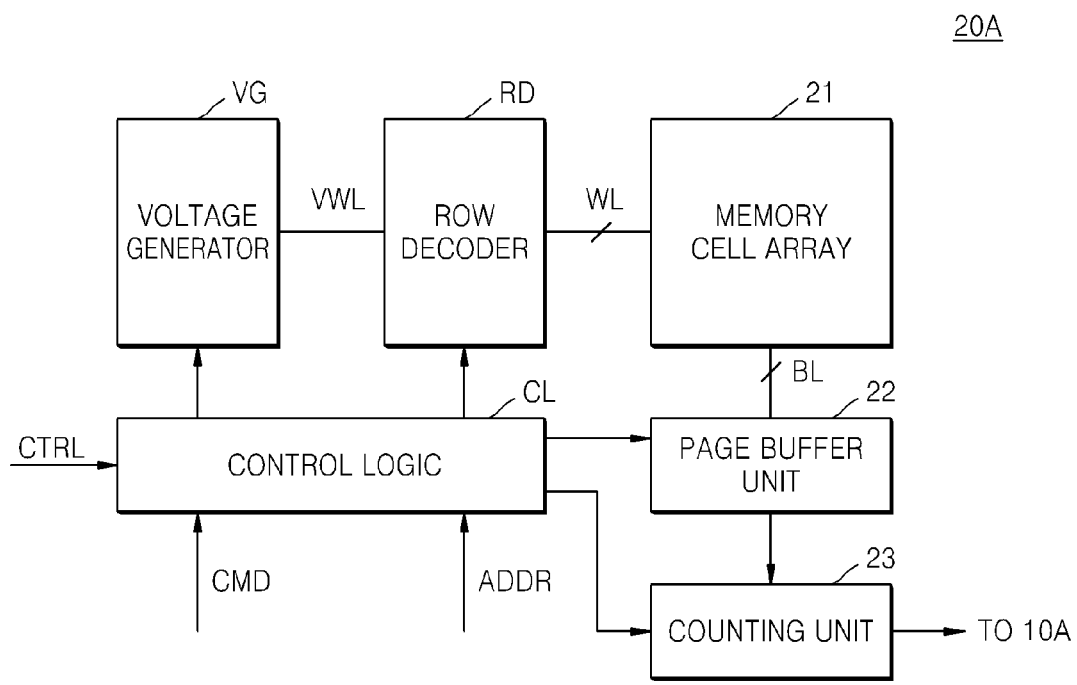
FIG. 2 is a block diagram of a memory device of the memory system illustrated in FIG. 1.

FIG. 2 is a block diagram of the memory device 20A of the memory system 1 illustrated in FIG. 1 according to an embodiment of the inventive concept.

Referring to FIG. 2, the memory device 20A may include the memory cell array 21, the page buffer unit 22, the counting unit 23, a control logic CL, a voltage generator VG, and a row decoder RD. Hereinafter, elements included in the memory device 20A will be described in detail.

The control logic CL may output various control signals to write data to the memory cell array 21 or to read data from the memory cell array 21 based on a command signal CMD, an address signal ADDR, and a control signal CTRL which are received from the memory controller 10A. Here, the various control signals output from the control logic CL may be transferred to the voltage generator VG, the row decoder RD, the page buffer unit 22, and the counting unit 23.

The voltage generator VG may generate a driving voltage VWL for driving a plurality of wordlines WL based on the control signal received from the control logic CL. In more detail, the driving voltage VWL may be a write voltage (or a program voltage), a read voltage, an erase voltage, or a pass voltage.

The row decoder RD may activate some of the plurality of wordlines WL based on a row address. In more detail, during a read operation, the row decoder RD may apply a read voltage to a selected wordline WL and may apply a pass voltage to an unselected wordline WL. In addition, during a write operation, the row decoder RD may apply a write voltage to the selected wordline WL and may apply a pass voltage to the unselected wordline WL.

The plurality of page buffers included in the page buffer unit 22 may be connected to the memory cell array 21 via a plurality of bit lines BL, respectively. In more detail, during the read operation, the plurality of page buffers may function as a sense amplifier and may output data stored in the memory cell array 21. In addition, during the write operation, the plurality of page buffers may function as a write driver and may input data to be stored to the memory cell array 21. In another embodiment, the plurality of page buffers may be connected to a data input/output circuit (not shown) via a plurality of data lines (not shown), respectively.

The counting unit 23 may count the number of the memory cells that exist in each of the plurality of sections defined by the different voltage levels, and may provide a counting result to the read voltage determining unit 12 included in the memory controller 10A. In the present embodiment, the counting unit 23 may include at least one counter, and the number of counters may correspond to the number of sectors or pages of the memory cell array 21 on which a read operation is performed. Accordingly, the memory device 20A may perform a read voltage determining operation for each sector or each page.

Figure 3:
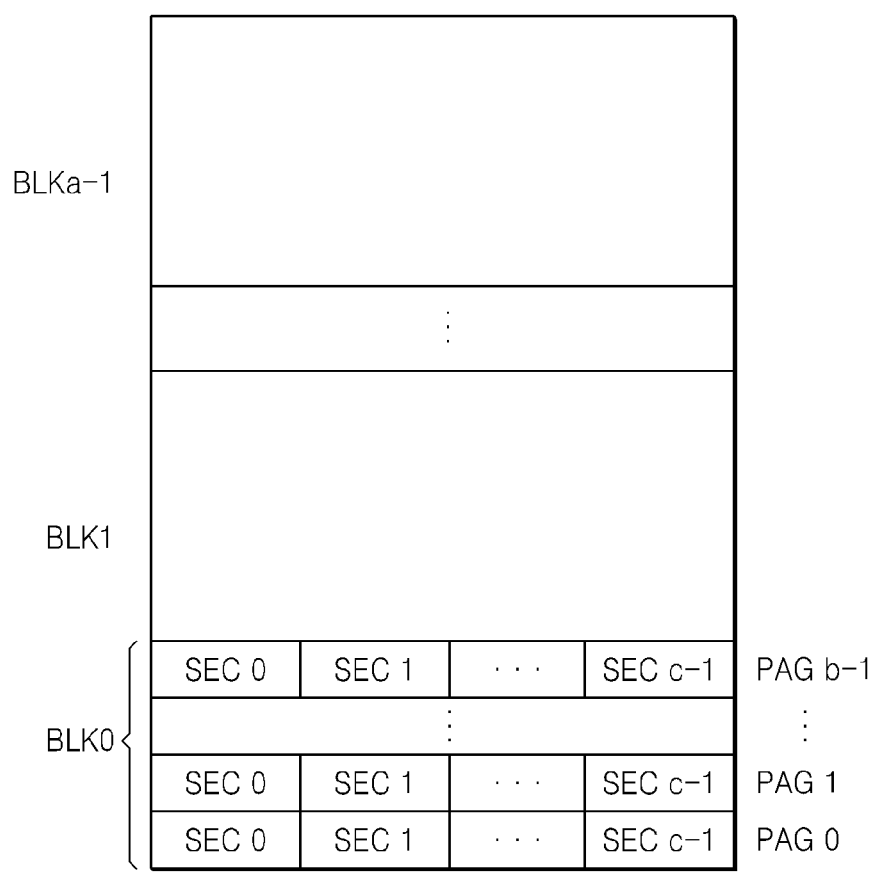
FIG. 3 illustrates an example of a memory cell array of the memory device of FIG. 2.

FIG. 3 illustrates an example of the memory cell array 21 of the memory device 20A of FIG. 2.

Referring to FIG. 3, the memory cell array 21 may be a flash memory cell array. In this case, the memory cell array 21 may include a (where a is an integer that is equal to or greater than 2) blocks BLK0 to BLKa−1, and each of the a blocks BLK0 to BLKa−1 may include b (where b is an integer that is equal to or greater than 2) pages PAG0 to PAGb-1, and each of the b pages PAG0 to PAGb-1 may include c (where c is an integer that is equal to or greater than 2) sectors SEC0 to SECc-1. In FIG. 3, for convenience, the b pages PAG0 to PAGb-1 and the c sectors SEC0 to SECc-1 are illustrated only in the block BLK0. However, the other blocks BLK1 to BLKa-1 may have the same structure as that of the block BLK0.

Figure 4:
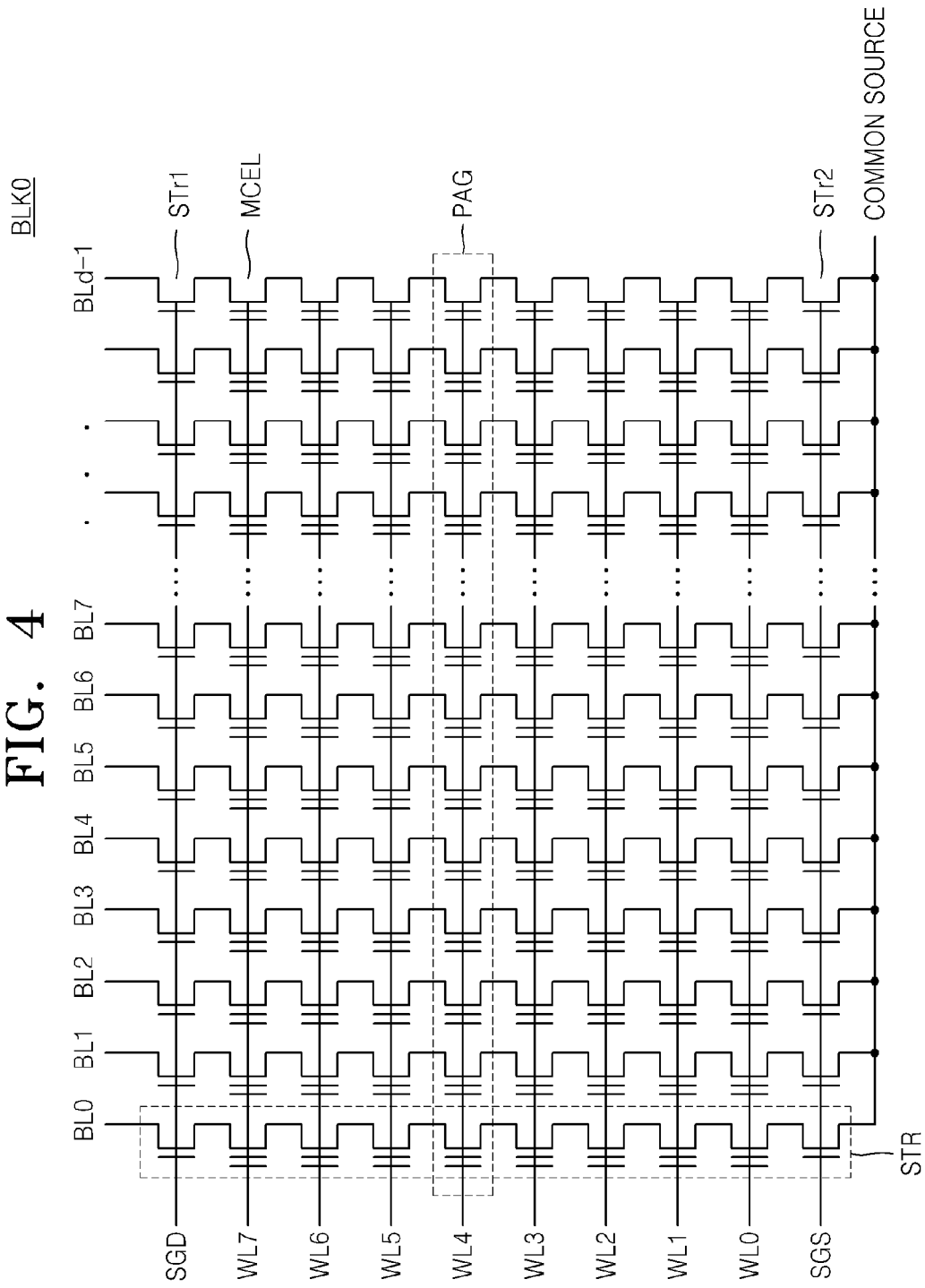
FIG. 4 is a circuit diagram of an example of a memory block of the memory cell array of FIG. 3.

FIG. 4 is a circuit diagram of an example of the memory block BLK0 of the memory cell array 21 of FIG. 3.

Referring to FIG. 4, the memory cell array 21 may be a memory cell array of a NAND flash memory. In this case, each of the a blocks BLK0 to BLKa-1 illustrated in FIG. 3 may be implemented as illustrated in FIG. 4. Referring to FIG. 4, each of the a blocks BLK0 to BLKa-1 may include d (where d is an integer that is equal to or greater than 2) strings STR in which 8 memory cells MCEL are connected in series in the directions of bitlines BL0 to BLd-1. Each of the d strings STR may include a drain selection transistor STr1 and a source selection transistor STr2, which are connected to ends of the 8 memory cells MCEL connected in series.

The NAND flash memory device having the structure of FIG. 4 may perform an erasing operation in units of blocks and may perform a programming operation in units of pages PAG that correspond to data stored in the memory cells MCEL of each of the wordlines WL0 to WL7. FIG. 4 illustrates an example in which 8 pages PAG corresponding to 8 wordlines WL0 to WL7 are disposed on one block. However, the a blocks BLK0 to BLKa-1 of the memory cell array 21 illustrated in FIG. 3 may include memory cells and pages, the number of which is different from the number of the memory cells MCEL and the pages PAG illustrated in FIG. 4. In addition, the memory device 20A of FIGS. 1 and 2 may include a plurality of memory cell arrays that perform the same operation as or have the same structure as that of the memory cell array 21 described above.

Figure 5:
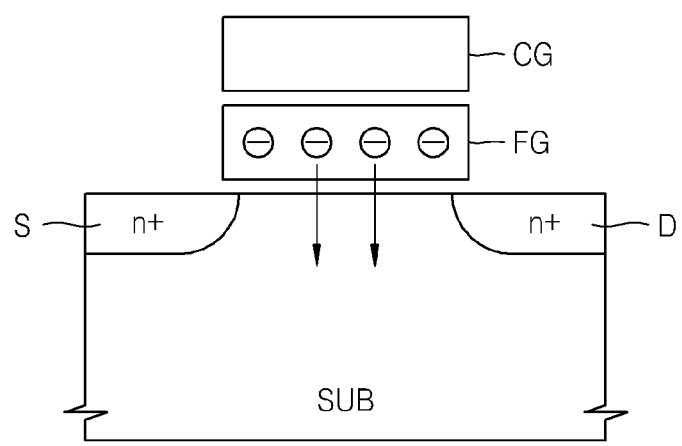
FIG. 5 is a cross-sectional view of an example of a memory cell of the memory block of FIG. 4.

FIG. 5 is a cross-sectional view of an example of the memory cell MCEL of the memory block BLK0 of FIG. 4.

Referring to FIG. 5, a source region S and a drain region D may be formed on a substrate SUB, and a channel region may be formed between the source region S and the drain region D. A floating gate FG may be formed above the channel region, and an insulating layer, such as a tunneling insulating layer, may be disposed between the channel region and the floating gate FG. A control gate CG may be formed above the floating gate FG, and an insulating layer, such as a blocking insulating layer, may be disposed between the floating gate FG and the control gate CG. Voltages required for programming, erasing, and reading operations of the memory cell MCEL may be applied to the substrate SUB, the source region S, the drain region D, and the control gate CG.

In the flash memory device, data stored in the memory cell MCEL may be read by distinguishing a threshold voltage Vth of the memory cell MCEL. In this case, the threshold voltage Vth of the memory cell MCEL may be determined based on the amount of electrons stored in the floating gate FG. In detail, as the amount of electrons stored in the floating gate FG increases, the threshold voltage Vth of the memory cell MCEL may increase.

The electrons stored in the floating gate FG of the memory cell MCEL may leak in a direction of the arrows depicted in FIG. 5 for various reasons, and thus, the threshold voltage Vth of the memory cell MCEL may vary. For example, the electrons stored in the floating gate FG may leak due to wear of the memory cell MCEL. In detail, when an access operation, such as a programming, erasing, or reading operation of the memory cell MCEL, is repeatedly performed, the insulating layer between the channel region and the floating gate FG may degrade. Thus, the electrons stored in the floating gate FG may leak. In addition, the electrons stored in the floating gate FG may leak due to a high-temperature stress or a difference in temperatures when the programming/reading operation is performed.

FIG. 6A is a graph illustrating a distribution of memory cells versus threshold voltages (i.e., threshold voltage distributions) of the memory device 20A when the memory cell MCEL of FIG. 5 is a 3-bit multi-level cell.

Referring to FIG. 6A, the horizontal axis represents threshold voltages Vth, and the vertical axis represents the number of memory cells MCEL. In a 3-bit multi-level cell in which the memory cells MCEL are programmed with 3 bits, the memory cells MCEL may be in one state among an erased state E, a first programmed state P1, a second programmed state P2, a third programmed state P3, a fourth programmed state P4, a fifth programmed state P5, a sixth programmed state P6, and a seventh programmed state P7. In a multi-level cell, the distance between distributions of the threshold voltages Vth is smaller when compared to that of a single level cell. Accordingly, in the multi-level cell, even a small variation of the threshold voltages Vth can result in significant read errors.

A first read voltage Vr1 is at a voltage level between a distribution of the memory cell MCEL in the erased state E and a distribution of the memory cell MCEL in the first programmed state P1. A second read voltage Vr2 is at a voltage level between a distribution of the memory cell MCEL in the first programmed state P1 and a distribution of the memory cell MCEL in the second programmed state P2. A third read voltage Vr3 is at a voltage level between a distribution of the memory cell MCEL in the second programmed state P2 and a distribution of the memory cell MCEL in the third programmed state P3. A fourth read voltage Vr4 is at a voltage level between a distribution of the memory cell MCEL in the third programmed state P3 and a distribution of the memory cell MCEL in the fourth programmed state P4. A fifth read voltage Vr5 is at a voltage level between a distribution of the memory cell MCEL in the fourth programmed state P4 and a distribution of the memory cell MCEL in the fifth programmed state P5. A sixth read voltage Vr6 is at a voltage level between a distribution of the memory cell MCEL in the fifth programmed state P5 and a distribution of the memory cell MCEL in the sixth programmed state P6. A seventh read voltage Vr7 is at a voltage level between a distribution of the memory cell MCEL in the sixth programmed state P6 and a distribution of the memory cell MCEL in the seventh programmed state P7.

For example, when the first read voltage Vr1 is applied to the control gate CG of the memory cell MCEL, the memory cell MCEL in the erased state E is turned on, whereas the memory cell MCEL in the first programmed state P1 is turned off. When the memory cell MCEL is turned on, a current flows through the memory cell MCEL, and when the memory cell MCEL is turned off, the current does not flow through the memory cell MCEL. Thus, data stored in the memory cell MCEL may be discriminated depending on whether the memory cell MCEL is turned on.

In one embodiment, it may be discriminated that data '1' is stored when the memory cell MCEL is turned on in response to the first read voltage Vr1 applied thereto, and data '0' is stored when the memory cell MCEL is turned off. However, aspects of the inventive concept are not limited thereto, and in another embodiment, it may be discriminated that data '0' is stored when the memory cell MCEL is turned on in response to the first read voltage Vr1 applied thereto, and data '1' is stored when the memory cell MCEL is turned off. As described above, allocation of logic levels of data may vary according to embodiments.

FIG. 6B is a graph illustrating a case in which the threshold voltages of the memory cells MCEL in the graph of FIG. 6A have varied.

Referring to FIG. 6B, the memory cells MCEL that are respectively programmed into the erased state E and the first through seventh programmed states P1 through P7 may have varied distributions due to an external stimulus and/or wear, as shown in FIG. 6B. In FIG. 6B, read errors may occur in the memory cells MCEL within a hatched portion of the distributions, and thus, the reliability of the memory device 20A may deteriorate.

For example, when a reading operation is performed on the memory device 20A by using the first read voltage Vr1, even if the memory cells MCEL within the hatched portion are programmed in the first programmed state P1, the memory cells MCEL may be determined to be in the erased state E due to a reduction in the threshold voltages Vth. Thus, errors occur in the reading operation, and the reliability of the memory device 20A may deteriorate.

When data is read from the memory device 20A, a raw bit error rate (RBER) varies according to a level of a read voltage. An optimum level of the read voltage may be determined based on the shape of the distribution of the memory cells MCEL. Thus, as the distribution of the memory cells MCEL varies, an optimum voltage level of the read voltage required for reading data from the memory device 20A may vary. Thus, the optimum level of the read voltage may be determined by varying the level of the read voltage based on the variation of the distribution.

As described above, the case where the memory cells MCEL is a 3-bit multi-level cell has been described with reference to FIGS. 6A and 6B. However, aspects of the inventive concept are not limited thereto, and the memory cell MCEL of FIG. 5 may be a single level cell, a 2-bit multi-level cell, or a multi-level cell that is programmed with 4 bits or more. In addition, the memory device 20A of FIGS. 1 and 2 may include memory cells MCEL that are programmed with a different number of bits.

Figure 7:
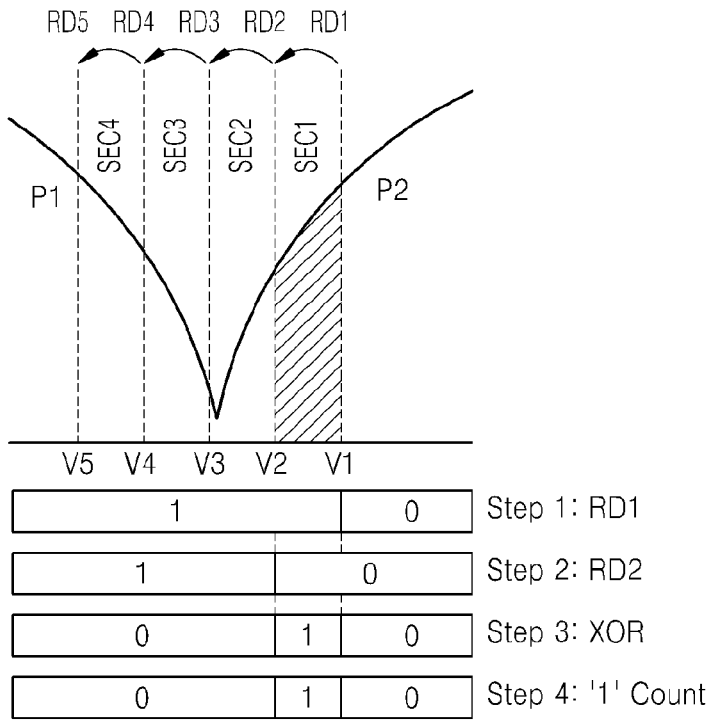
FIG. 7 is a diagram for use in explaining a read voltage determining operation of the memory device included in the memory system of FIG. 1.

FIG. 7 is a diagram for reference in describing a read voltage determining operation of the memory device 20A included in the memory system 1 of FIG. 1 according to an embodiment of the inventive concept.

Referring to FIG. 7, the memory controller 10A may perform the read voltage determining operation so as to determine an optimum level of a read voltage between two adjacent states of the memory cells MCEL included in the memory device 20A. In more detail, the memory controller 10A may read a plurality of pieces of data from the memory cells MCEL at a plurality of different voltage levels V1 through V5, respectively, between the first programmed state P1 and the second programmed state P2 which are the two adjacent states of the memory cells MCEL. The memory device 20A may perform a logic operation on two pieces of data which are respectively read at two voltage levels that are adjacent to each other from among a plurality of different voltage levels, and may count the number of memory cells MCEL that exist in each of a plurality of sections, based on a result of the logic operation. The read voltage determining operation may be referred to as a minimal error search (MES) operation.

In one embodiment, the counting unit 23 may be arranged in each sector, and thus the MES operation may be performed in each sector. In another embodiment, the counting unit 23 may be arranged in each page, and thus the MES operation may be performed in each page. In other embodiments, the counting unit 23 may be arranged in each page, but may independently control sectors in each page, so that the MES operation may be performed in each sector, as will be described later with reference to FIG. 11.

In the present embodiment, the number of the different voltage levels V1 through V5 is five, but aspects of the inventive concept are not limited thereto, and the number of the voltage levels may be varied from this example. Also in this embodiment, levels of the read voltage may be decreased from the first voltage level V1 to the fifth voltage level V5.

However, aspects of the inventive concept are not limited thereto, and the levels of the read voltages may be increased from the fifth voltage level V5 to the first voltage level V1.

In Step 1, a plurality of pieces of data are read from the memory cells MCEL at the first voltage level V1. Here, the memory cells MCEL with a threshold voltage Vth that is less than the first voltage level V1 are read as '1', and the memory cells MCEL with a threshold voltage Vth that is higher the first voltage level V1 are read as '0'. In this manner, first data read in Step 1 may be temporarily stored in the page buffer unit 22.

In Step 2, a plurality of pieces of data are read from the memory cells MCEL at the second voltage level V2. Here, the memory cells MCEL with a threshold voltage Vth that is less than the second voltage level V2 are read as '1', and the memory cells MCEL with a threshold voltage Vth that is higher than the second voltage level V2 are read as '0'. In this manner, second data read in Step 2 may be temporarily stored in the page buffer unit 22.

In Step 3, each of the plurality of page buffers included in the page buffer unit 22 performs a logic operation on the first data read at the first voltage level V1 and the second data read at the second voltage level V2. For example, each of the plurality of page buffers may perform an XOR operation on the first data and the second data.

In a case of the memory cell MCEL of which threshold voltage Vth is less than the second voltage level V2, results of the XOR operation on the first data and the second data are '0', in a case of the memory cell MCEL of which threshold voltage Vth is between the second voltage level V2 and the first voltage level V1, results of the XOR operation on the first data and the second data are '1', and in a case of the memory cell MCEL of which threshold voltage Vth is higher than the first voltage level V1, results of the XOR operation on the first data and the second data are '0'. Thus, according to the results of the XOR operation on the first data and the second data, it is possible to recognize whether a memory cell is included in a section SEC1 that is defined by two adjacent voltage levels (i.e., V1 and V2). In more detail, the memory cell is included in a section of which an XOR operation result is '1'.

In Step 4, with respect to each of the plurality of sections, the counting unit 23 may count the number of '1' outcomes from the results of the XOR operation performed by the page buffer unit 22. By doing so, the counting unit 23 may count the number of the memory cells MCEL that exist in each of the plurality of sections. The read voltage determining unit 12 may detect a valley that is a voltage level of a section having the least number of the memory cells MCEL from among the plurality of sections, and may determine the voltage level as an optimum level of the read voltage.

Figure 8:
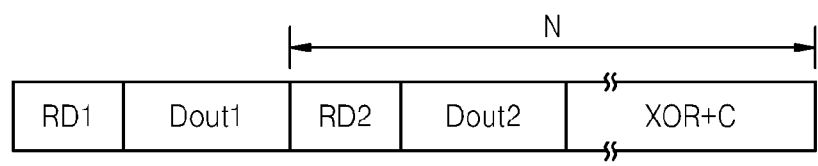
FIG. 8 is a diagram for use in explaining a read operation of a memory device according to a comparative example.

FIG. 8 illustrates a read operation of a memory device according to a comparative example.

Referring to FIG. 8, when an MES operation is performed by dividing a space between two adjacent states of memory cells into N sections (where N is a natural number that is equal to or greater than 2), the MES operation includes an operation RD1 of reading first data from the memory cells at a first voltage level, an operation Dout1 of transmitting the read first data to a memory controller, an operation RD2 of reading second data from the memory cells at a second voltage level, an operation Dout2 of transmitting the read second data to the memory controller, and an operation XOR+C of performing XOR operations on the first and second data and counting the number of '1's from the results of performing the XOR operations.

For example, a time required to perform each of the operations RD1 and RD2 of reading the first and second data may be about 50 μs. When the data transmitting operations Dout1 and Dout2 are performed at 120 MHz, a time required to perform the data transmitting operations Dout1 and Dout2 may be about 150 μs. When the XOR operation and counting operation XOR+C is performed at 60 MHz, a time required to perform the XOR operation and the counting operation XOR+C may be about 205 μs. When N is 10, a time required for the entire MES operation may be about 6.25 ms.

A main factor for power consumption in the time required to perform the MES operation is the time required for the data transmitting operations Dout1 and Dout2 and the time required for the XOR operation and the counting operation XOR+C. In addition, the memory controller has an additional storage space (for example, a static random access memory (SRAM) buffer) in which the transmitted first and second data are stored. Furthermore, power may be consumed to perform the data transmitting operations Dout1 and Dout2 and the XOR operation and the counting operation XOR+C.

Figure 9:
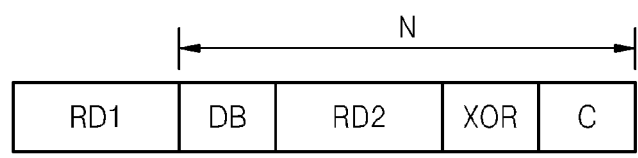
FIG. 9 is a diagram for use in explaining a read operation of the memory device included in the memory system of FIG. 1, according to an embodiment of the inventive concept.

FIG. 9 illustrates a read operation of the memory device 20A included in the memory system 1 of FIG. 1, according to an embodiment of the inventive concept.

Referring to FIG. 9, in the present embodiment, the memory device 20A may include the page buffer unit 22 and the counting unit 23, each of the plurality of page buffers may perform an XOR operation, and the counting unit 23 may count the number of '1' outcomes from a result of the XOR operation. By doing so, when a space between two adjacent states of the memory cell MCEL is divided into N sections (where, N is a natural number equal to or greater than 2) and then an MES operation is performed in the N sections, the MES operation includes an operation RD1 of reading first data from the memory cell MCEL at a first voltage level, an operation DB of storing (i.e., a back-up) the read first data in the page buffer unit 22, an operation RD2 of reading second data from the memory cell MCEL at a second voltage level, an operation XOR of performing an XOR operation on the first data stored in the page buffer unit 22, and the read second data, and an operation C in which the counting unit 23 counts the number of '1' outcomes from a result of the XOR operation.

For example, a time taken to perform each of the operations RD1 and RD2 of reading the first data and the second data may be about 50 μs. A time taken to perform the operation DB of storing the first data is about 3 μs, and a time taken to perform the operation XOR and the operation C may be about 24 μs. When N is 10, a time taken to completely perform the MES operation is about 0.8 ms which is considerably reduced as compared to the comparative example of FIG. 8.

As described above, because each of the plurality of page buffers backs up or stores the first data, it is not required to transmit the first data to the memory controller 10A, so that a time taken in the data transmitting operation may be reduced. Also, because each of the plurality of page buffers performs the XOR operation on the backed-up first data and the read second data, the XOR operation may be performed in a parallel manner, so that a time taken in the XOR operation may be considerably reduced. Also, because the counting unit 23 may perform a high-speed operation, a time taken to count the number of '1' outcomes from the results of the XOR operation may be considerably reduced. Further, it is not required for the memory controller 10A to have a separate storage space to store the read first and second data, so that the size of the memory controller 10A may be reduced, and power consumption required to transmit the first and second data may be decreased.

Figure 10:
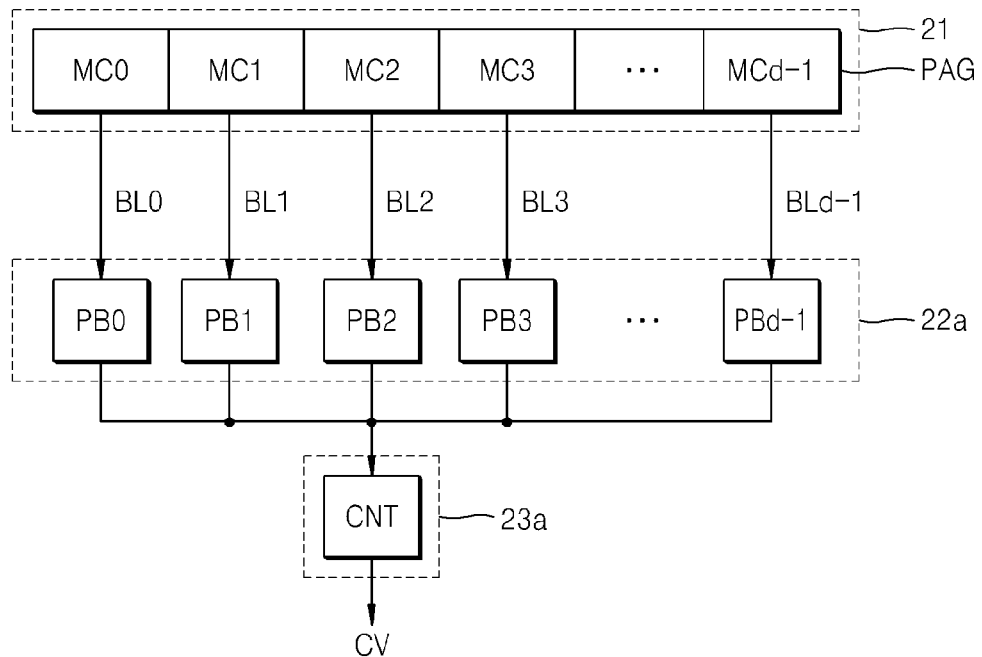
FIG. 10 is a block diagram of a memory device included in the memory system of FIG. 1, according to an embodiment of the inventive concept.

FIG. 10 is a block diagram of a memory device 20a included in the memory system 1 of FIG. 1, according to an embodiment of the inventive concept.

Referring to FIG. 10, the memory device 20a may include a memory cell array 21, a page buffer unit 22a, and a counting unit 23a.

The memory cell array 21 may include a page PAG. The page PAG may include d memory cells MC0, MC1, MC2, MC3, ..., MCd−1. As described previously, the d memory cells MC0, MC1, MC2, MC3, ..., MCd−1 may be connected to a same word line. Although FIG. 10 illustrates a case in which the memory cell array 21 includes one page PAG, the memory cell array 21 may include a plurality of pages.

The page buffer unit 22a may include a plurality of page buffers PB0, PB1, PB2, PB3, ..., PBd−1. The plurality of page buffers PB0, PB1, PB2, PB3, ..., PBd−1 may be connected to memory cells MC0, MC1, MC2, MC3, ..., MCd−1, respectively, via corresponding bitlines BL0, BL1, BL2, BL3, ..., BLd−1. The plurality of page buffers PB0, PB1, PB2, PB3, ..., PBd−1 may temporarily store data to be written to the memory cell array 21 or data read from the memory cell array 21.

In more detail, when a read operation with respect to the memory device 20a is performed, the plurality of page buffers PB0, PB1, PB2, PB3, ..., PBd−1 store a plurality of pieces of data that are sequentially read from the memory cells MC0, MC1, MC2, MC3, ..., MCd−1 at different voltage levels. Here, each of the plurality of page buffers PB0, PB1, PB2, PB3, ..., PBd−1 may perform a logic operation on the a plurality of pieces of stored data.

In the present embodiment, each of the plurality of page buffers PB0, PB1, PB2, PB3, ..., PBd−1 may perform an XOR operation on two pieces of data which are respectively read at two adjacent voltage levels from among the different voltage levels.

Although not illustrated, each of the plurality of page buffers PB0, PB1, PB2, PB3, ..., PBd−1 may include a switching device (e.g., an n-channel metal-oxide-semiconductor field-effect transistor (NMOS transistor)). The switching device may have a control terminal (e.g., a gate) to which an output value of a corresponding page buffer is applied, and an output terminal (e.g., a source) that is connected to the counting unit 23a. Thus, when the output value of the corresponding page buffer is '1', the switching device may be turned on so that the switching device may supply a predetermined current to the counting unit 23a, and when the output value of the corresponding page buffer is '0', the switching device may be turned off so that the switching device may not supply a predetermined current to the counting unit 23a.

The counting unit 23a may count the number of memory cells that exist in each of a plurality of sections, based on a result of the logic operation which is output from the page buffer unit 22a, and may output a counting result CV. In more detail, the counting unit 23a may count the number of the memory cells by counting the number of '1's existing in each of the plurality of sections based on a result of the XOR operation which is output from the page buffer unit 22a. In the present embodiment, the counting unit 23a may perform the counting operation in a parallel manner on results of the logic operation which are output from the page buffer unit 22a.

In the present embodiment, the counting unit 23a may be an analog counter. In more detail, the counting unit 23a may detect a quantity of a current applied thereto, and may count the number of turned-on switching devices from among switching devices that are included in the plurality of page buffers PB0, PB1, PB2, PB3, . . . , PBd−1. In this manner, the counting unit 23a counts the number of the turned-on switching devices, so that the counting unit 23a may count the number of '1's existing in each of the plurality of sections based on the result of the XOR operation, and thus, may count the number of the memory cells that exist in each of the plurality of sections.

Figure 11:
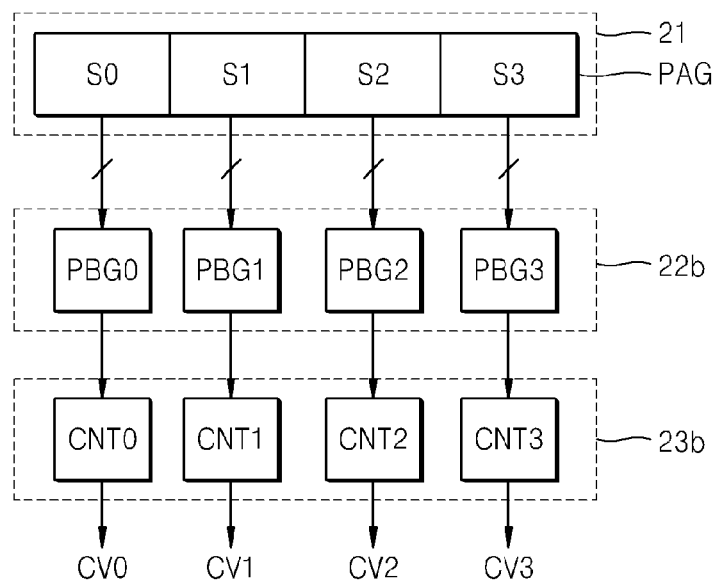
FIG. 11 is a block diagram of a memory device included in the memory system of FIG. 1, according to another embodiment of the inventive concept.

FIG. 11 is a block diagram of a memory device 20b included in the memory system 1 of FIG. 1, according to another embodiment of the inventive concept.

Referring to FIG. 11, the memory device 20b may include a memory cell array 21, a page buffer unit 22b, and a counting unit 23b.

The memory cell array 21 may include a page PAG. The page PAG may include a plurality of sectors S0, S1, S2, and S3. Although FIG. 11 illustrates a case in which the memory cell array 21 includes one page PAG, the memory cell array 21 may include a plurality of pages. Also, in FIG. 11, the page PAG includes four sectors S0, S1, S2, and S3 but aspects of the inventive concept are not limited thereto. The number of sectors included in the page PAG may vary and a size of each of the sectors may vary.

The page buffer unit 22b may include a plurality of page buffer groups PBG0, PBG1, PBG2, and PBG3. The plurality of page buffer groups PBG0, PBG1, PBG2, and PBG3 may be connected to the sectors S0, S1, S2, and S3, respectively, via corresponding bitlines. Here, each of the plurality of page buffer groups PBG0, PBG1, PBG2, and PBG3 may include a plurality of page buffers (not shown). The plurality of page buffers may be connected to a plurality of memory cells (not shown), respectively, via corresponding bitlines.

The counting unit 23b may include a plurality of counters CNT0, CNT1, CNT2, and CNT3. The plurality of counters CNT0, CNT1, CNT2, and CNT3 are connected to the plurality of page buffer groups PBG0, PBG1, PBG2, and PBG3, respectively. In this manner, the counting unit 23b may include the plurality of counters CNT0, CNT1, CNT2, and CNT3 which correspond to the number of the sectors S0, S1, S2, and S3. The plurality of counters CNT0, CNT1, CNT2, and CNT3 may output counting results CV0, CV1, CV2, and CV3 with respect to the sectors S0, S1, S2, and S3 which correspond to the plurality of counters CNT0, CNT1, CNT2, and CNT3, respectively.

As described above, according to the present embodiment, the counting unit 23b may include the counters CNT0, CNT1, CNT2, and CNT3 which correspond to the sectors S0, S1, S2, and S3, respectively, and by doing so, the counting unit 23b may perform an MES operation in units of sectors. When the memory controller 10A performs an ECC in units of sectors, although a read error was corrected via the ECC, the read error may occur. In this case, a counting operation may be performed only on a counter having the read error from among the plurality of counters CNT0, CNT1, CNT2, and CNT3, so that unnecessary operations with respect to sectors not having the read error may be omitted.

Figure 12:
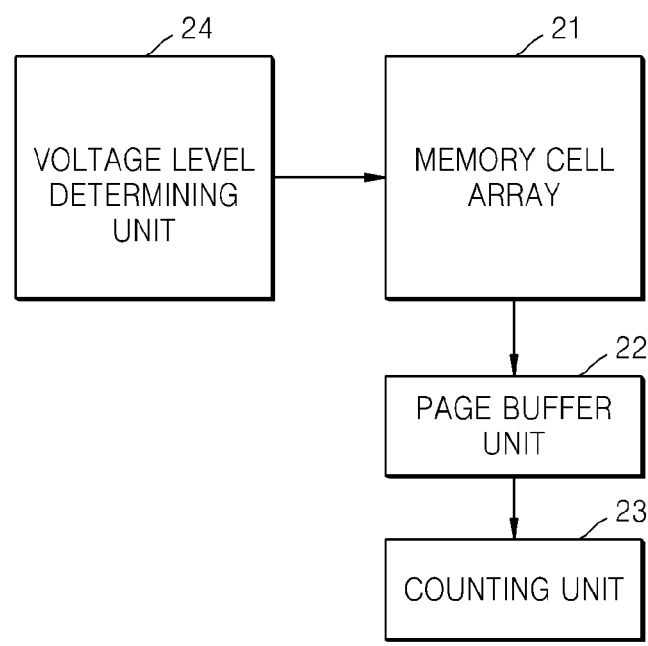
FIG. 12 is a block diagram of a memory device included in the memory system of FIG. 1, according to another embodiment of the inventive concept.

FIG. 12 is a block diagram of a memory device 20A' included in the memory system 1 of FIG. 1, according to another embodiment of the inventive concept.

Referring to FIG. 12, the memory device 20A' may include a memory cell array 21, a plurality of page buffer units 22, a counting unit 23, and a voltage level determining unit 24. Some elements included in the memory device 20A' according to the present embodiment are substantially the same as elements included in the memory device 20A of FIG. 1. Like reference numerals refer to like elements, and the same elements as those of the memory device 20A of FIG. 1 and further description is omitted here.

The voltage level determining unit 24 may determine different voltage levels which are applied to the memory cell array 21. Here, the different voltage levels may be required to perform an MES operation on the memory cell array 21. In order to perform the MES operation, a voltage level, which is applied to the memory cell array 21 whenever a read operation is performed on the memory cell array 21, has to be constantly increased or decreased.

According to the present embodiment, the memory device 20A' includes the voltage level determining unit 24, so that the different voltage levels to perform the MES operation may be updated in the memory device 20A'. Thus, it is not required to perform a data exchange between the memory controller 10A and the memory device 20A' so as to set the different voltage levels.

Figure 13:
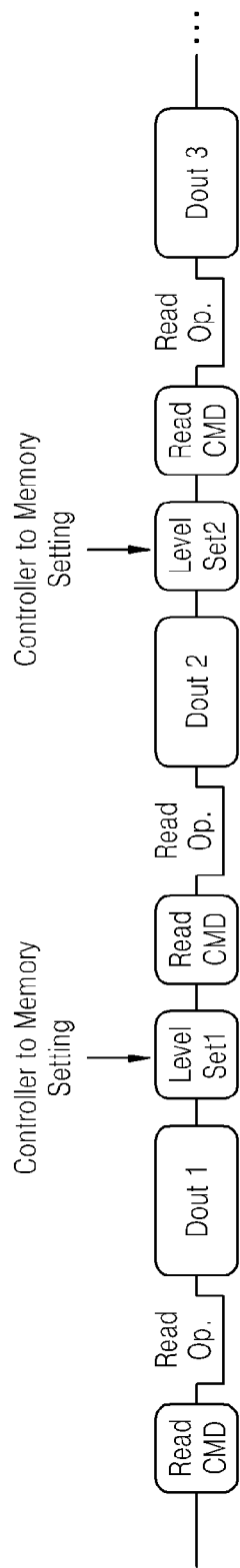
FIG. 13 illustrates a voltage level changing operation of a memory device according to a comparative example.

FIG. 13 illustrates a voltage level changing operation of a memory device according to a comparative example.

Referring to FIG. 13, in order to change voltage levels that are applied to a memory cell array when an MES operation is performed, a memory controller provides the memory device with a control signal that is information indicative of the voltage levels to be changed.

In more detail, the memory device receives a read command Read CMD from the memory controller, performs a read operation at a start voltage level (Read Op.), and provides read data to the memory controller (Dout1). Afterward, the memory device receives information about a first voltage level from the memory controller (Level Set 1), receives a read command Read CMD, performs a read operation at the first voltage level (Read Op.), and provides read data to the memory controller (Dout2). Afterward, the memory device receives information about a second voltage level from the memory controller (Level Set 2), receives a read command Read CMD, performs a read operation at the second voltage level (Read Op.), and provides read data to the memory controller (Dout3).

Figure 14:
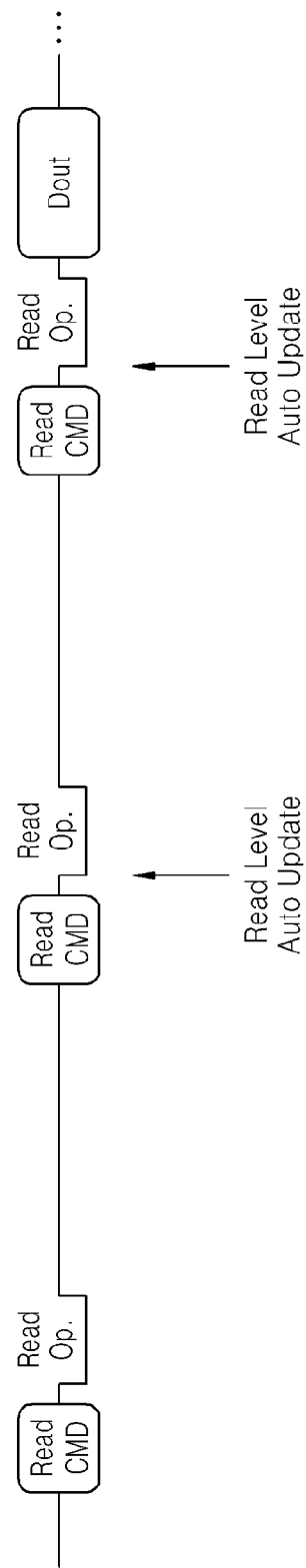
FIG. 14 illustrates a voltage level changing operation by the memory device of FIG. 12, according to an embodiment of the inventive concept.

FIG. 14 illustrates a voltage level changing operation by the memory device 20A' of FIG. 12, according to an embodiment of the inventive concept.

Referring to FIG. 14, the memory device 20A' includes the voltage level determining unit 24 capable of determining different voltage levels which are applied to the memory cell array 21.

In more detail, the memory device 20A' receives a read command Read CMD from the memory controller 10A, performs a read operation at a start voltage level (Read Op.), and backs up read first data to the page buffer unit 22. Afterward, the memory device 20A' receives a read command Read CMD from the memory controller 10A, performs a read operation at a first voltage level (Read Op.), and performs an XOR operation on the backed-up first data and read second data. Here, the first voltage level is determined by the voltage level determining unit 24 and thus is automatically updated in the memory device 20A'.

Afterward, the memory device 20A' receives a read command Read CMD from the memory controller 10A, performs a read operation at a second voltage level (Read Op.), and provides the memory controller 10A with the number of '1's which is counted from a result of the XOR operation with respect to the first data and the second data (Dout). Here, the second voltage level is determined by the voltage level determining unit 24 and thus is automatically updated in the memory device 20A'.

Figure 15:
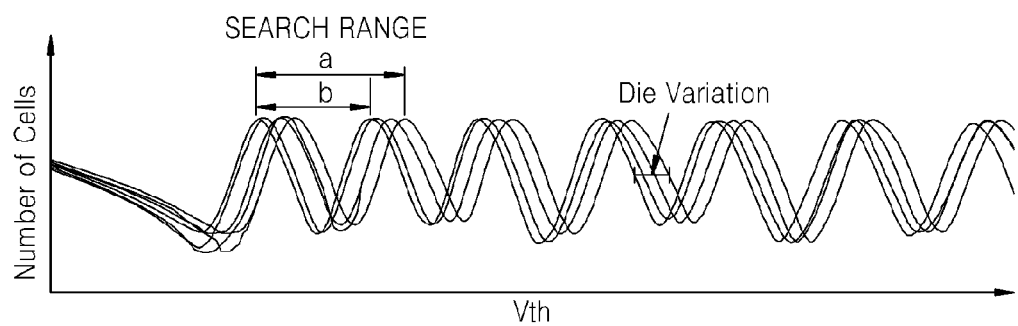
FIG. 15 is a graph illustrating threshold voltage distributions of a plurality of memory cells.

FIG. 15 is a graph illustrating a distribution of a plurality of memory cells MCEL versus threshold voltages of the plurality of memory cells MCEL.

Referring to FIG. 15, the horizontal axis represents threshold voltages Vth of the memory cells MCEL, and the vertical axis represents the number of the memory cells MCEL. Due to manufacturing imperfections, the characteristics of a die whereon memory chips are integrated differs from the characteristics of another die whereon other memory chips are integrated. Also, die characteristics can vary within the same die dependent on location. This is called die variation. Due to the die variation, as illustrated in FIG. 15, the threshold voltage distribution of the plurality of memory cells MCEL may vary from die to die and within each die.

In an ideal case without the die variation, an MES operation is performed in a search range b so as to determine an optimum level of a read voltage between two adjacent states. However, in an actual case with die variation, the MES operation has to be performed in a search range a so as to determine the optimum level of the read voltage between the two adjacent states. As such, a time taken to perform the MES operation is increased, and power consumption occurs when performing the MES operation.

Figure 16:
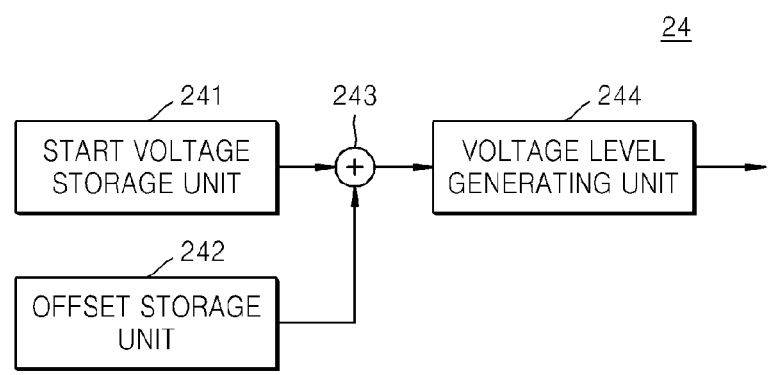
FIG. 16 is a block diagram of a voltage level determining unit included in the memory device of FIG. 12.

FIG. 16 is a block diagram of the voltage level determining unit 24 included in the memory device 20N of FIG. 12.

Referring to FIG. 16, the voltage level determining unit 24 may include a start voltage storage unit 241, an offset storage unit 242, an adding unit 243, and a voltage level generating unit 244. Hereinafter, with reference to FIGS. 15 and 16, elements included in the voltage level determining unit 24 will be described.

The start voltage storage unit 241 may store a start voltage that is applied to the memory cell array 21. Here, the start voltage may vary in different memory chips, in consideration of die variation. In more detail, in order to equally provide the different memory chips with a voltage that is finally generated by the voltage level determining unit 24, the start voltage may vary with respect to the different memory chips. For example, the start voltage storage unit 241 may store a digital value of the start voltage.

The offset storage unit 242 may store a plurality of pre-defined offset voltages. Here, the plurality of offset voltages may be equally defined with respect to the different memory chips. Because the start voltage storage unit 241 stores the start voltage that varies in the different memory chips, in consideration of die variation, the offset storage unit 242 does not have to determine the offset voltages in consideration of the die variation. For example, the offset storage unit 242 may store digital values of the plurality of offset voltages.

The adding unit 243 may add one of the plurality of offset voltages to the start voltage. For example, an addition result output from the adding unit 243 may be a digital value.

The voltage level generating unit 244 may generate an analog voltage level from the addition result output from the adding unit 243. Thus, the voltage level that is finally generated may be equally provided to the different memory chips.

Figure 17:
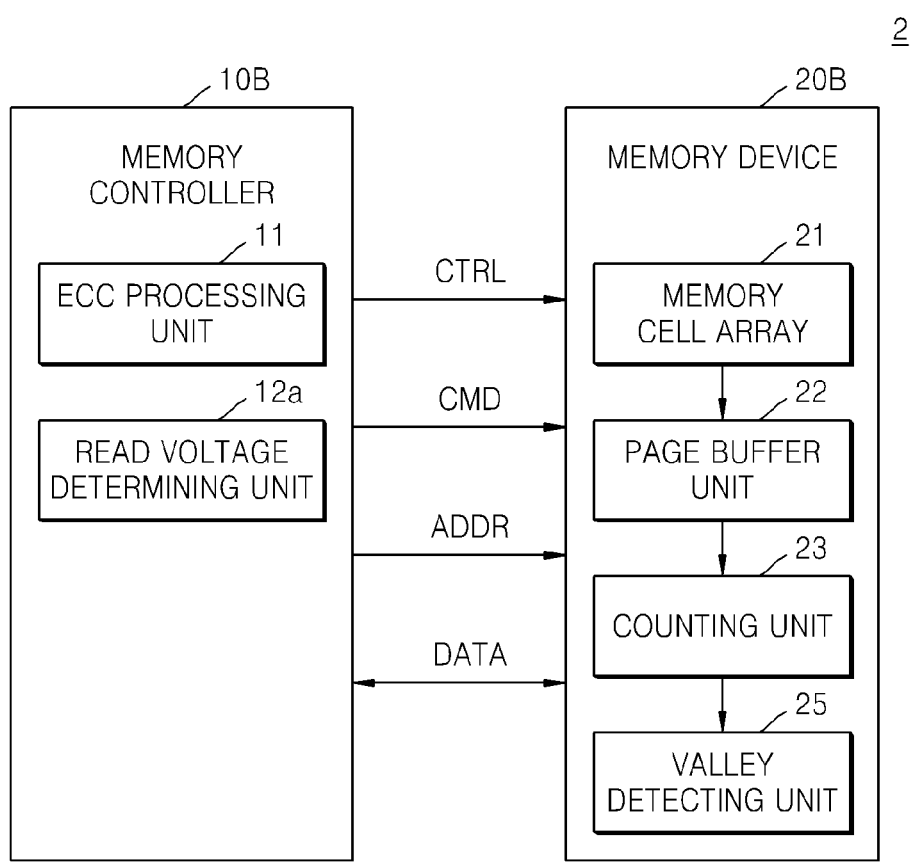
FIG. 17 is a block diagram of a memory system according to another embodiment of the inventive concept.

FIG. 17 is a block diagram of a memory system 2 according to another embodiment of the inventive concept.

Referring to FIG. 17, the memory system 2 may include a memory controller 10B and a memory device 20B. The memory controller 10B may include an ECC processing unit 11 and a read voltage determining unit 12a. The memory device 20B may include a memory cell array 21, a page buffer unit 22, a counting unit 23, and a valley detecting unit 25. Some of elements included in the memory device 20B according to the present embodiment are substantially the same as elements included in the memory device 20A of FIG. 1. Also, some of elements included in the memory controller 10B according to the present embodiment are substantially the same as elements included in the memory controller 10A of FIG. 1. Like reference numerals refer to like elements, and the same elements as those of the memory controller 10A and the memory device 20A of FIG. 1 and a description thereof is omitted here.

The valley detecting unit 25 may detect a voltage level corresponding to a valley between two adjacent states of the memory cell MCEL based on an output from the counting unit 23. By doing so, the output from the counting unit 23 is not required to be provided to the memory controller 10B, so that a data exchange between the memory controller 10B and the memory device 20B may be simplified, and thus, an operation time and power consumption thereof may be reduced. Also, the memory controller 10B is not required to have an additional storage space (e.g., an SRAM buffer or the like) to store the output from the counting unit 23.

The read voltage determining unit 12a may receive the voltage level corresponding to the valley detected by the valley detecting unit 25, may determine the voltage level as a read voltage, and may provide the read voltage to the memory device 20B.

When an MES operation is performed at at least a 2× speed, the MES operation may be simultaneously performed on a plurality of mats included in the memory cell array 21, and here, the valley detecting unit 25 may detect the valley in units of mats.

Although not illustrated, the memory device 20B may further include the voltage level determining unit 24 shown in FIG. 12.

Figure 18:
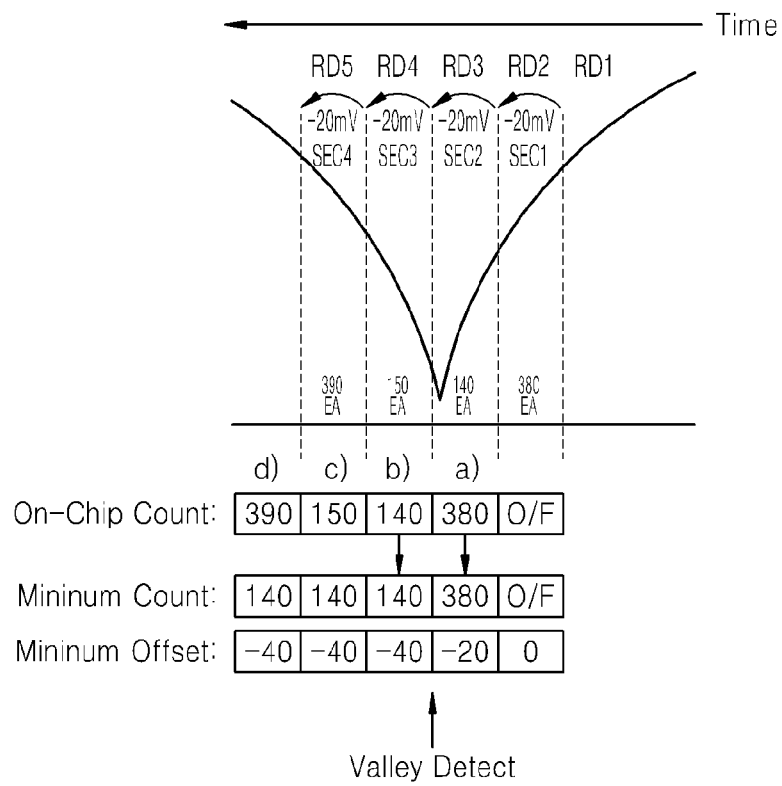
FIG. 18 is a diagram for use in explaining an operation of a memory device of FIG. 17.

FIG. 18 is a diagram for reference in describing an operation of the memory device 20B of FIG. 17.

Referring to FIG. 18, an operation to determine an optimal voltage level of a read voltage between a sixth programmed state P6 and a seventh programmed state P7, which are two adjacent states of the memory cell MCEL, may be performed based on a start voltage that is a first voltage level V1, and an offset that is −20 mV. The counting unit 23 counts the number of the memory cells MCEL in each of first through fourth sections SEC1 through SEC4, which are defined by first through fifth voltage levels V1 through V5. Here, the number of the memory cells MCEL may be obtained by counting the number of '1' outcomes from the results of an XOR operation performed by the page buffer unit 22.

The first section SEC1 is between the first voltage level V1 and the second voltage level V2 that is less than the first voltage level V1 by 20 mV, and the counting unit 23 counts the number of the memory cells MCEL as 380 in the first section SEC1. The second section SEC2 is between the second voltage level V2 and the third voltage level V3 that is less than the second voltage level V2 by 20 mV, and the counting unit 23 counts the number of the memory cells MCEL as 140 in the second section SEC2. The third section SEC3 is between the third voltage level V3 and the fourth voltage level V4 that is less than the third voltage level V3 by 20 mV, and the counting unit 23 counts the number of the memory cells MCEL as 150 in the third section SEC3. The fourth section SEC4 is between the fourth voltage level V4 and the fifth voltage level V5 that is less than the fourth voltage level V4 by 20 mV, and the counting unit 23 counts the number of the memory cells MCEL as 390 in the fourth section SEC4.

Figure 19:
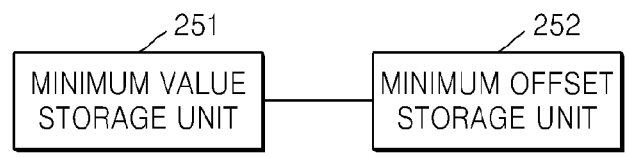
FIG. 19 is a block diagram illustrating a valley detecting unit included in the memory device of FIG. 17, according to an embodiment of the inventive concept.

FIG. 19 is a block diagram illustrating a valley detecting unit 25a included in the memory device 20B of FIG. 17, according to an embodiment of the inventive concept.

Referring to FIG. 19, the valley detecting unit 25a may include a minimum value storage unit 251 and a minimum offset storage unit 252. Hereinafter, elements included in the valley detecting unit 25a will now be described in detail with reference to FIGS. 18 and 19.

The minimum value storage unit 251 may store a minimum value of the memory cells MCEL that exist in each of a plurality of sections. In more detail, the minimum value storage unit 251 may store a minimum value of the numbers of the memory cells MCEL, which are counted for the first through fourth sections SEC1 through SEC4, respectively. For example, the minimum value storage unit 251 may store 140 that is the minimum value of the numbers of the memory cells MCEL, which are counted for the first through fourth sections SEC1 through SEC4, respectively.

The minimum offset storage unit 252 may store an offset as a minimum offset, wherein the offset corresponds to a section from among the first through fourth sections SEC1 through SEC4, which has a minimum counting value. In more detail, when a value counted in a current section is less than the minimum value stored in the minimum value storage unit 251, the minimum offset storage unit 252 may store an offset, which corresponds to the current section, as the minimum offset. Here, the minimum offset stored in the minimum offset storage unit 252 may be determined as a valley.

For example, in a case where a value counted for the second section SEC2 is 140 and the minimum value stored in the minimum value storage unit 251 is 380, because the value counted for the second section SEC2 is less than the minimum value stored in the minimum value storage unit 251, the minimum offset storage unit 252 may store −40 mV, which is an offset corresponding to the second section SEC2, as an minimum offset. In addition, in a case where a value counted for the third section SEC3 is 150 and the minimum value stored in the minimum value storage unit 251 is 140, because the value counted for the third section SEC3 is greater than the minimum value stored in the minimum value storage unit 251, the minimum offset storage unit 252 may keep storing −40 mV, which is previously stored, as a minimum offset.

According to the present embodiment, the memory device 20B may include the valley detecting unit 25a capable of storing a minimum offset. Thus, the memory device 20B is not required to provide the memory controller 10B with the output from the counting unit 23 whenever the MES operation is performed, and after the MES operation ends, the memory device 20B is required to provide only the voltage level of the valley to the memory controller 10B. Thus, an interface between the memory controller 10B and the memory device 20B is simplified. Also, it is not required for the memory controller 10B to separately calculate and store a voltage level whenever the MES operation is performed, so that a configuration of the memory controller 10B may be simplified.

Figure 20:
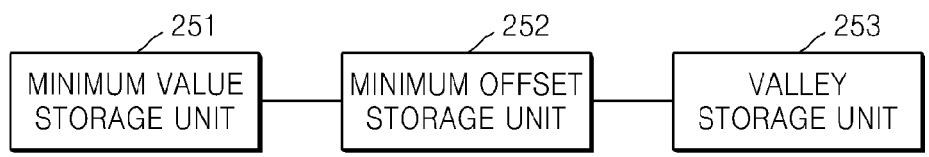
FIG. 20 is a block diagram illustrating a valley detecting unit included in the memory device of FIG. 17, according to another embodiment of the inventive concept.

FIG. 20 is a block diagram illustrating a valley detecting unit 25b included in the memory device 20B of FIG. 17, according to another embodiment of the inventive concept.

Referring to FIG. 20, the valley detecting unit 25b may include a minimum value storage unit 251, a minimum offset storage unit 252, and a valley storage unit 253. Some of elements included in the valley detecting unit 25b according to the present embodiment are substantially the same as elements included in the valley detecting unit 25a of FIG. 19. Like reference numerals refer to like elements, and the same elements as those of the valley detecting unit 25a of FIG. 19 are not described again.

The valley storage unit 253 may receive an output from the minimum offset storage unit 252 and thus may store a voltage level corresponding to a valley or an offset corresponding to the valley. The valley storage unit 253 may include a plurality of valley storage devices, and the number of the plurality of valley storage devices may correspond to the number of valleys between two adjacent stages of a memory cell. In more detail, when the memory cell is an n-bit memory cell, the number of the plurality of valley storage devices may be $2^n-1$.

Figure 21:
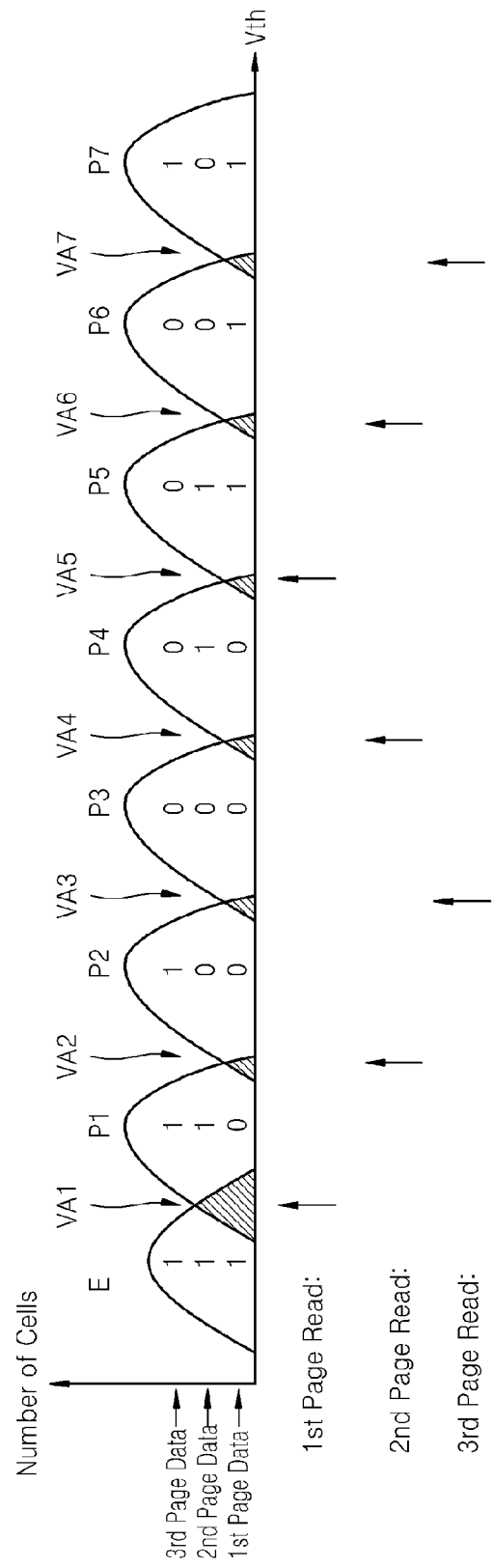
FIG. 21 is a diagram for use in explaining a read operation for each page when a memory cell is a 3-bit multi-level cell.

FIG. 21 is a graph for reference in describing a read operation for each page when a memory cell MCEL is a 3-bit multi-level cell.

Referring to FIG. 21, when the memory cell MCEL is a 3-bit multi-level cell, a read operation with respect to the memory cell MCEL may be performed three times, and eight pieces of state information may be divided and output in three pages. In the present embodiment, data '111' may be allocated to an erased state E, data '110' may be allocated to a first programmed state P1, data '100' may be allocated to a second programmed state P2, data '000' may be allocated to a third programmed state P3, data '010' may be allocated to a fourth programmed state P4, data '011' may be allocated to a fifth programmed state P5, data '001' may be allocated to a sixth programmed state P6, and data '101' may be allocated to a seventh programmed state P7. However, aspects of the inventive concept are not limited thereto, and data allocated to each programmed state may vary in other embodiments.

A first page read ($1^{st}$ Page Read) includes a read with respect to a first valley VA1 between the erased state E and the first programmed state P1, and a read with respect to a fifth valley VA5 between the fourth programmed state P4 and the fifth programmed state P5. A second page read ($2^{nd}$ Page Read) includes a read with respect to a second valley VA2 between the first programmed state P1 and the second programmed state P2, a read with respect to a fourth valley VA4 between the third programmed state P3 and the fourth programmed state P4, and a read with respect to a sixth valley VA6 between the fifth programmed state P5 and the sixth programmed state P6. A third page read ($3^{rd}$ Page Read) includes a read with respect to a third valley VA3 between the second programmed state P2 and the third programmed state P3, and a read with respect to a seventh valley VA7 between the sixth programmed state P6 and the seventh programmed state P7.

In more detail, when the read is performed on the first valley VA1 and the fifth valley VA5 in the first page read ($1^{st}$ Page Read), if the first valley VA1 indicates an 'off cell' and the fifth valley VA5 indicates an 'on cell', first page data ($1^{st}$ Page Data) may be output as '0', and if not, the first page data ($1^{st}$ Page Data) may be output as '1'. Next, when the read is performed on the second valley VA2, the fourth valley VA4, and the sixth valley VA6 in the second page read ($2^{nd}$ Page Read), if the second valley VA2 indicates an 'off cell' and the fourth valley VA4 indicates an 'on cell', second page data ($2^{nd}$ Page Data) may be output as '0', if the sixth valley VA6 indicates an 'off cell', the second page data ($2^{nd}$ Page Data) may be output as '0', and if not, the second page data ($2^{nd}$ Page Data) may be output as '1'. Next, when the read is performed on the third valley VA3 and the seventh valley VA7 in the third page read ($3^{rd}$ Page Read), if the third valley VA3 indicates an 'off cell' and the seventh valley VA7 indicates an 'on cell', third page data ($3^{rd}$ Page Data) may be output as '0', and if not, the third page data ($3^{rd}$ Page Data) may be output as '1'.

Referring back to FIG. 20, the valley storage unit 253 may store voltage levels that correspond to different valleys, respectively, or offsets that correspond to the different valleys, respectively. When the memory cell MCEL is a 3-bit multi-level cell, the valley storage unit 253 may store voltage levels or offsets, which correspond to the first through seventh valleys VA1 through VA7, respectively.

Figure 22:
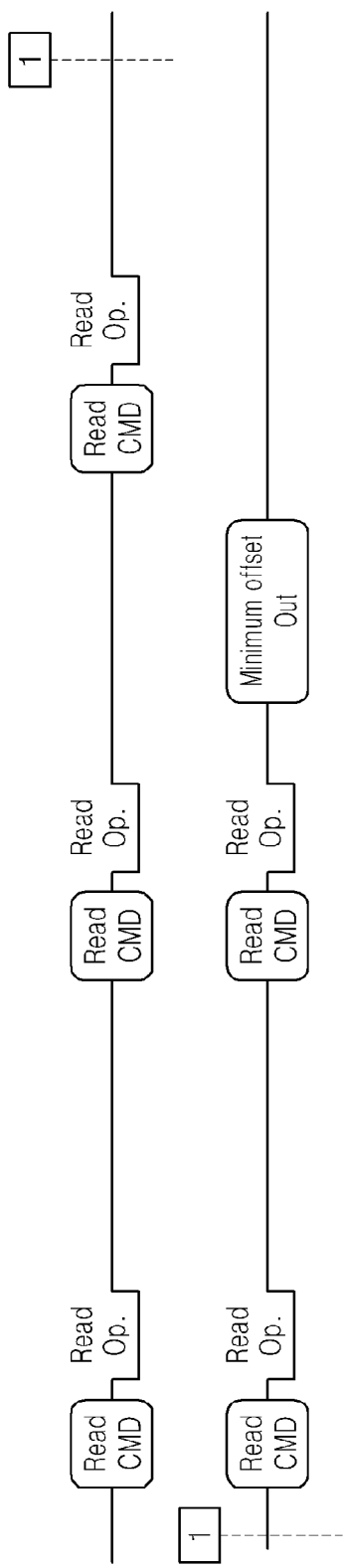
FIG. 22 is a timing diagram of a read operation by the memory device of FIG. 17, according to an embodiment of the inventive concept.

FIG. 22 is a timing diagram of a read operation by the memory device 20B of FIG. 17, according to an embodiment of the inventive concept.

Referring to FIG. 22, the memory device 20B may include the valley detecting unit 25 and may detect a valley between two adjacent states of the memory cell MCEL based on a value counted by the counting unit 23.

In more detail, the memory device 20B receives a read command Read CMD from the memory controller 10B and performs a read operation (Read Op.), and the page buffer unit 22 backs up read first data. Afterward, the memory device 20B receives a read command Read CMD from the memory controller 10B and performs a read operation (Read Op.), and the page buffer unit 22 performs an XOR operation on the backed-up first data and read second data.

After the memory device 20B repeats the read and operation, the memory device 20B receives a final command Final CMD from the memory controller 10B and provides the memory controller 10B with a minimum offset that is stored in the minimum offset storage unit 252 according to a result of an MES operation. In another embodiment, the memory device 20B may receive a final command Final CMD from the memory controller 10B and may provide the memory controller 10B with a voltage level or an offset, which corresponds to a valley and is stored in the valley storage unit 253 according to a result of an MES operation.

Figure 23:
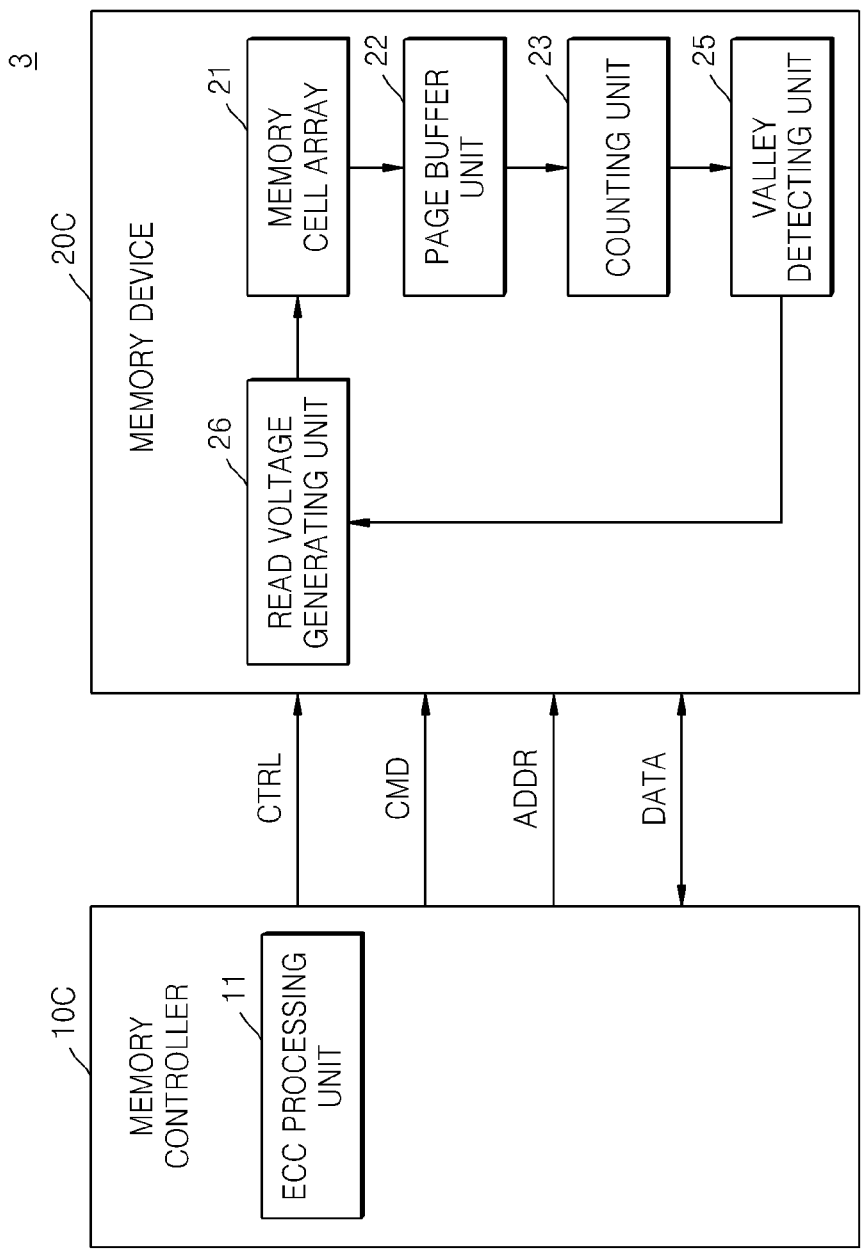
FIG. 23 is a block diagram of a memory system according to another embodiment of the inventive concept.

FIG. 23 a block diagram of a memory system 3 according to another embodiment of the inventive concept.

Referring to FIG. 23, the memory system 3 may include a memory controller 10C and a memory device 20C. The memory controller 10C includes an ECC processing unit 11.

The memory device 20C may include a memory cell array 21, a page buffer unit 22, a counting unit 23, a valley detecting unit 25, and a read voltage generating unit 26. Some of elements included in the memory device 20C according to the present embodiment are substantially the same as elements included in the memory device 20B of FIG. 17. Also, some of elements included in the memory controller 10C according to the present embodiment are substantially the same as elements included in the memory controller 10A of FIG. 1. Like reference numerals refer to like elements, and the same elements as those of the memory controller 10A of FIG. 1 and the memory device 20B of FIG. 17 and a description thereof is not repeated here.

The valley detecting unit 25 may detect a voltage level corresponding to a valley between two adjacent states of the memory cell MCEL based on an output from the counting unit 23. By doing so, the output from the counting unit 23 is not required to be provided to the memory controller 10C, so that a data exchange between the memory controller 10C and the memory device 20C may be simplified, and thus, an operation time and power consumption thereof may be reduced. Also, the memory controller 10C is not required to have an additional storage space (e.g., an SRAM buffer or the like) to store the output from the counting unit 23.

The read voltage generating unit 26 may provide the memory cell array 21 with the voltage level corresponding to the valley detected by the valley detecting unit 25. Here, the valley detected by the valley detecting unit 25 may be information about an optimal voltage level of a read voltage that is finally generated after an MES operation ends. As described above, the optimal voltage level of the read voltage which is obtained as a result of the MES operation may be used in a read operation with respect to the memory cell array 21.

According to the present embodiment, because the memory device 20C includes the read voltage generating unit 26, when the MES operation ends and thus the valley is detected by the valley detecting unit 25, the detected valley may not be provided to the memory controller 10C, but may instead be provided to the read voltage generating unit 26 included in the memory device 20C. Thus, it is not required to perform a data exchange between the memory controller 10C and the memory device 20C so as to perform the read operation with respect to the memory cell array 21.

Although not illustrated, the memory device 20C may further include the voltage level determining unit 24 of FIG. 12.

Figure 24:
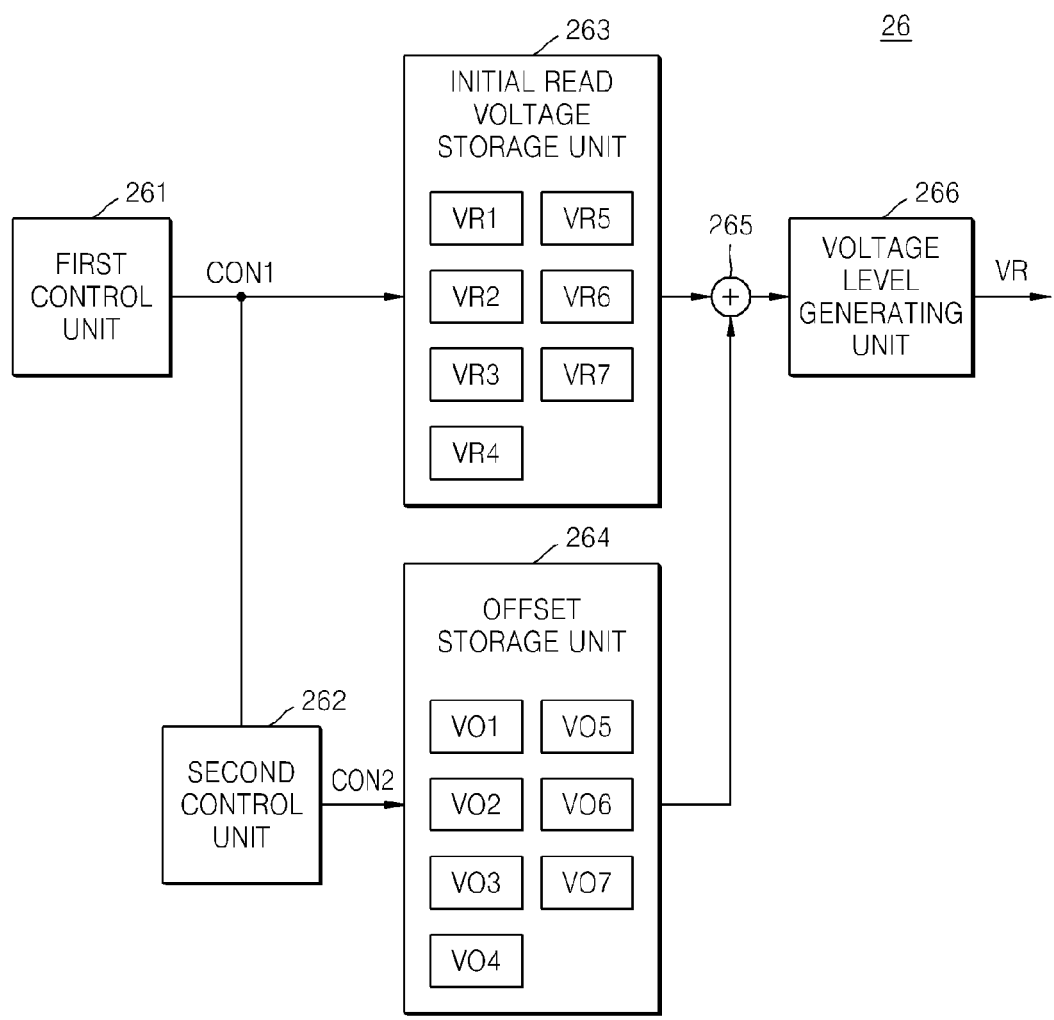
FIG. 24 is a block diagram of a read voltage generating unit of FIG. 23, according to an embodiment of the inventive concept.

FIG. 24 is a block diagram of the read voltage generating unit 26 of FIG. 23, according to an embodiment of the inventive concept.

Referring to FIG. 24, the read voltage generating unit 26 may include a first control unit 261, a second control unit 262, an initial read voltage storage unit 263, an offset storage unit 264, an adding unit 265, and a voltage level generating unit 266. Hereinafter, elements included in the read voltage generating unit 26 will be described in detail.

The initial read voltage storage unit 263 may store a plurality of initial read voltages which respectively correspond to valleys between two adjacent states from among a plurality of states of the memory cell MCEL. In more detail, when the memory cell MCEL is an n-bit memory cell, the initial read voltage storage unit 263 may store $2^n-1$ initial read voltages. Here, the initial read voltages stored in the initial read voltage storage unit 263 may be digital values.

The offset storage unit 264 may store a plurality of offsets which correspond to the valleys, respectively. In more detail, when the memory cell MCEL is an n-bit memory cell, the offset storage unit 264 may store $2^n-1$ offsets. Here, the plurality of offsets stored in the offset storage unit 264 may be generated as a result of an MES operation and may be digital values which correspond to values that are output by the valley detecting unit 25.

The first control unit 261 may control the initial read voltage storage unit 263 to select one of the plurality of initial read voltages stored in the initial read voltage storage unit 263. Here, the first control unit 261 may output a first control signal CON1 that is a digital value to select one of the plurality of initial read voltages.

The second control unit 262 may control the offset storage unit 264 to use one of the plurality of offsets stored in the offset storage unit 264 so as to generate a read voltage. In more detail, the second control unit 262 may control the offset storage unit 264 to apply a valley to the read voltage generation, wherein the valley is detected after a plurality of MES operations are ended. Here, the second control unit 262 may receive the first control signal CON1 and thus may output a second control signal CON2 that is a digital value to select one of the plurality of offsets stored in the offset storage unit 264.

The adding unit 265 may add one of the plurality of initial read voltages stored in the initial read voltage storage unit 263 to one of the plurality of offsets stored in the offset storage unit 264. In the present embodiment, an addition result output from the adding unit 265 may be a digital value.

The voltage level generating unit 266 may generate an analog voltage level VR from the output from the adding unit 265. The analog voltage level VR may correspond to an optimal voltage level of the read voltage, may be applied to the memory cell array 21, and thus may be used to perform the read operation.

Figure 25:
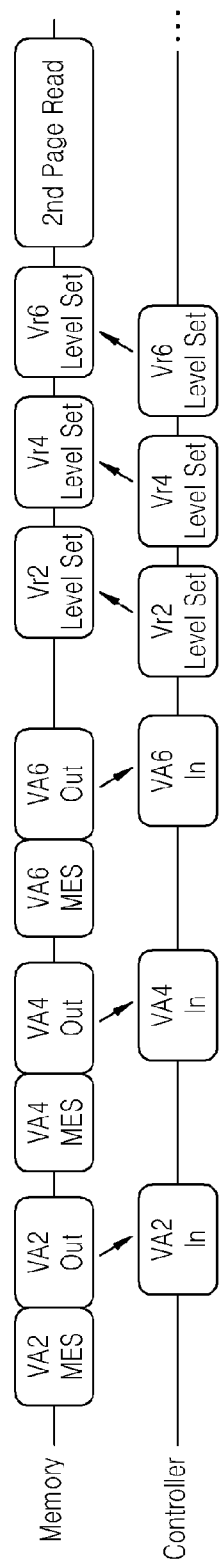
FIG. 25 is a timing diagram of operation sequences of a memory device and a memory controller according to a comparative example.

FIG. 25 is a timing diagram of operation sequences of a memory device and a memory controller according to a comparative example.

Referring to FIG. 25, for example, when a memory cell MCEL is a 3-bit multi-level cell, and an MES operation is performed for a second page read, the memory device performs an MES operation with respect to the second valley VA2, and provides the detected second valley VA2 to the memory controller. Afterward, the memory device performs an MES operation with respect to the fourth valley VA4, and provides the detected fourth valley VA4 to the memory controller. Afterward, the memory device performs an MES operation with respect to the sixth valley VA6, and provides the detected sixth valley VA6 to the memory controller.

The memory controller provides the memory device with information about second, fourth, and sixth read voltages Vr2, Vr4, and Vr6 based on the received second, fourth, and sixth valleys VA2, VA4, and VA6, and the memory device performs the second page read based on the information.

Figure 26:
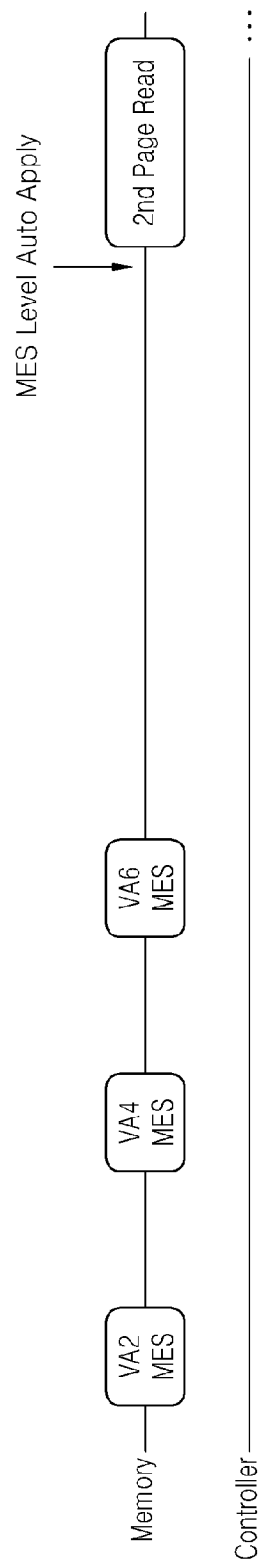
FIG. 26 is a timing diagram of operation sequences of the memory device and the memory controller of FIG. 23, according to an embodiment of the inventive concept.

FIG. 26 is a timing diagram of operation sequences of the memory device 20C and the memory controller 10C of FIG. 23, according to an embodiment of the inventive concept.

Referring to FIG. 26, when a memory cell MCEL is a 3-bit multi-level cell, and an MES operation is performed for a second page read, the memory device 20C performs an MES operation with respect to the second valley VA2, and stores the detected second valley VA2. Afterward, the memory device 20C performs an MES operation with respect to the fourth valley VA4, and stores the detected fourth valley VA4. Afterward, the memory device 20C performs an MES operation with respect to the sixth valley VA6, and stores the detected sixth valley VA6.

The memory device 20C may generate second, fourth, and sixth read voltages Vr2, Vr4, and Vr6 based on the stored second, fourth, and sixth valleys VA2, VA4, and VA6, may apply the second, fourth, and sixth read voltages Vr2, Vr4, and Vr6 to the memory cell array 21, and thus, may perform the second page read.

Figure 27:
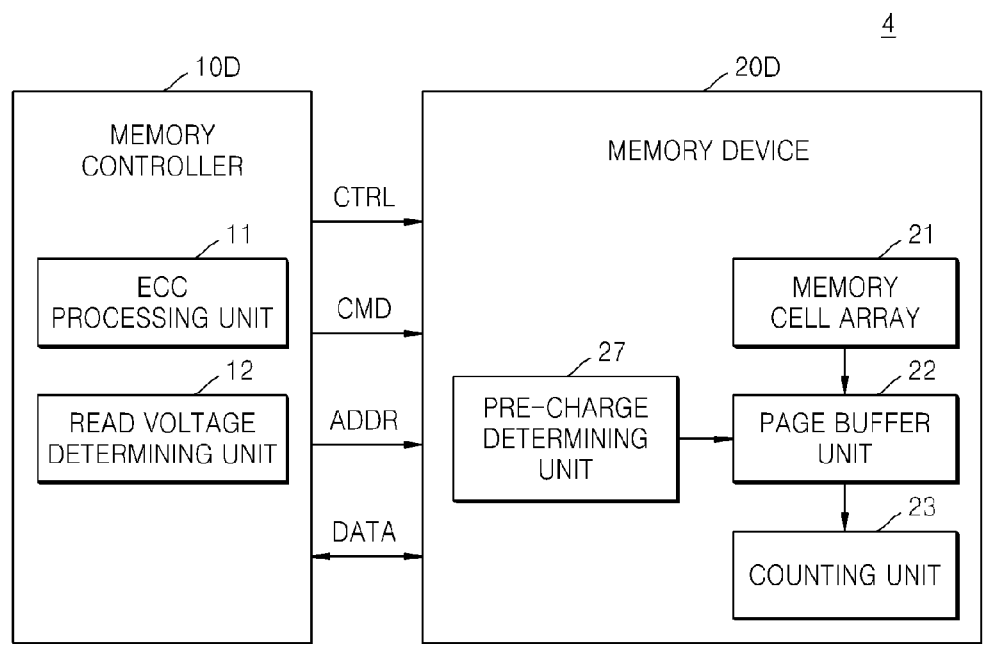
FIG. 27 is a block diagram of a memory system according to another embodiment of the inventive concept.

FIG. 27 is a block diagram of a memory system 4 according to another embodiment of the inventive concept.

Referring to FIG. 27, the memory system 4 may include a memory controller 10D and a memory device 20D. The memory controller 10D includes an ECC processing unit 11 and a read voltage determining unit 12. The memory device 20D may include a memory cell array 21, a page buffer unit 22, a counting unit 23, and a pre-charge determining unit 27. Some of elements included in the memory device 20D according to the present embodiment are substantially the same as elements included in the memory device 20A of FIG. 1. Like reference numerals refer to like elements, and the same elements as those of the memory device 20A of FIG. 1 and a description thereof is not repeated here. Also, some of elements included in the memory controller 10D according to the present embodiment are substantially the same as elements included in the memory controller 10A of FIG. 1. Like reference numerals refer to like elements, and the same elements as those of the memory controller 10A of FIG. 1 and a description thereof is not repeated here.

The pre-charge determining unit 27 may determine whether or not to pre-charge at least one bitline connected to at least one memory cell from among a plurality of memory cells included in the memory cell array 21. In the present embodiment, the at least one memory cell may be a memory cell of which a read voltage is already determined. In another embodiment, the at least one memory cell may be a memory cell of which a read voltage is not required to be detected.

According to the present embodiment, the memory device 20D includes the pre-charge determining unit 27, so that, when an MES operation is performed on each sector, an operation such as a pre-charge of a bitline of a memory core may be stopped with respect to a sector of which a valley is already detected or a sector that does not require the MES operation, and thus power consumption may be reduced. In this regard, while the pre-charge determining unit 27 is illustrated as a separate element, aspects of the inventive concept are not limited thereto, and the pre-charge determining unit 27 may be included in the page buffer unit 22.

In the present embodiment, the counting unit 23 may be arranged in units of sectors, so that the MES operation may be performed in units of sectors. In this case, the pre-charge determining unit 27 may determine whether or not to stop the pre-charge in units of sectors. In this manner, the pre-charge is stopped with respect to a sector of which a valley is detected, so that power consumption may be reduced.

In another embodiment, although the counting unit 23 may be arranged in units of pages, the MES operation may be performed in units of sectors. In this case, the pre-charge determining unit 27 may determine whether or not to stop the pre-charge in units of sectors. Because a result of an XOR operation with respect to a sector of which a pre-charge is stopped is always '0', although the counting unit 23 is arranged in units of pages, the number of memory cells may be counted for each sector. Thus, the MES operation may be performed in units of sectors.

Figure 28:
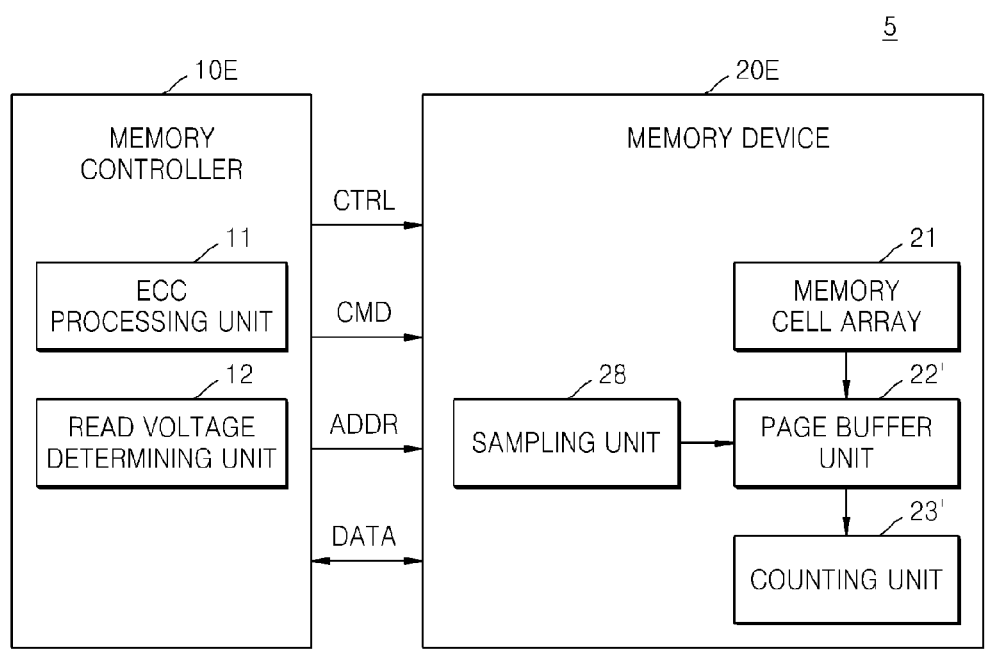
FIG. 28 is a block diagram of a memory system according to another embodiment of the inventive concept.

FIG. 28 is a block diagram of a memory system 5 according to another embodiment of the inventive concept.

Referring to FIG. 28, the memory system 5 may include a memory controller 10E and a memory device 20E. The memory controller 10E includes an ECC processing unit 11 and a read voltage determining unit 12. The memory device 20E may include a memory cell array 21, a page buffer unit 22', a counting unit 23', and a sampling unit 28.

Some of elements included in the memory device 20E according to the present embodiment are substantially the same as elements included in the memory device 20A of FIG. 1. Also, some of elements included in the memory controller 10E according to the present embodiment are substantially the same as elements included in the memory controller 10A of FIG. 1. Like reference numerals refer to like elements, and the same elements as those of the memory controller 10A and the memory device 20A of FIG. 1 and a description thereof is not repeated here.

The sampling unit 28 may perform sampling on at least one memory cell from among a plurality of memory cells included in the memory cell array 21, which performs an operation to detect a read voltage. In more detail, the sampling unit 28 may be connected to the page buffer unit 22' and thus may perform sampling on the at least one memory cell that performs an operation to detect a read voltage.

Figure 29:
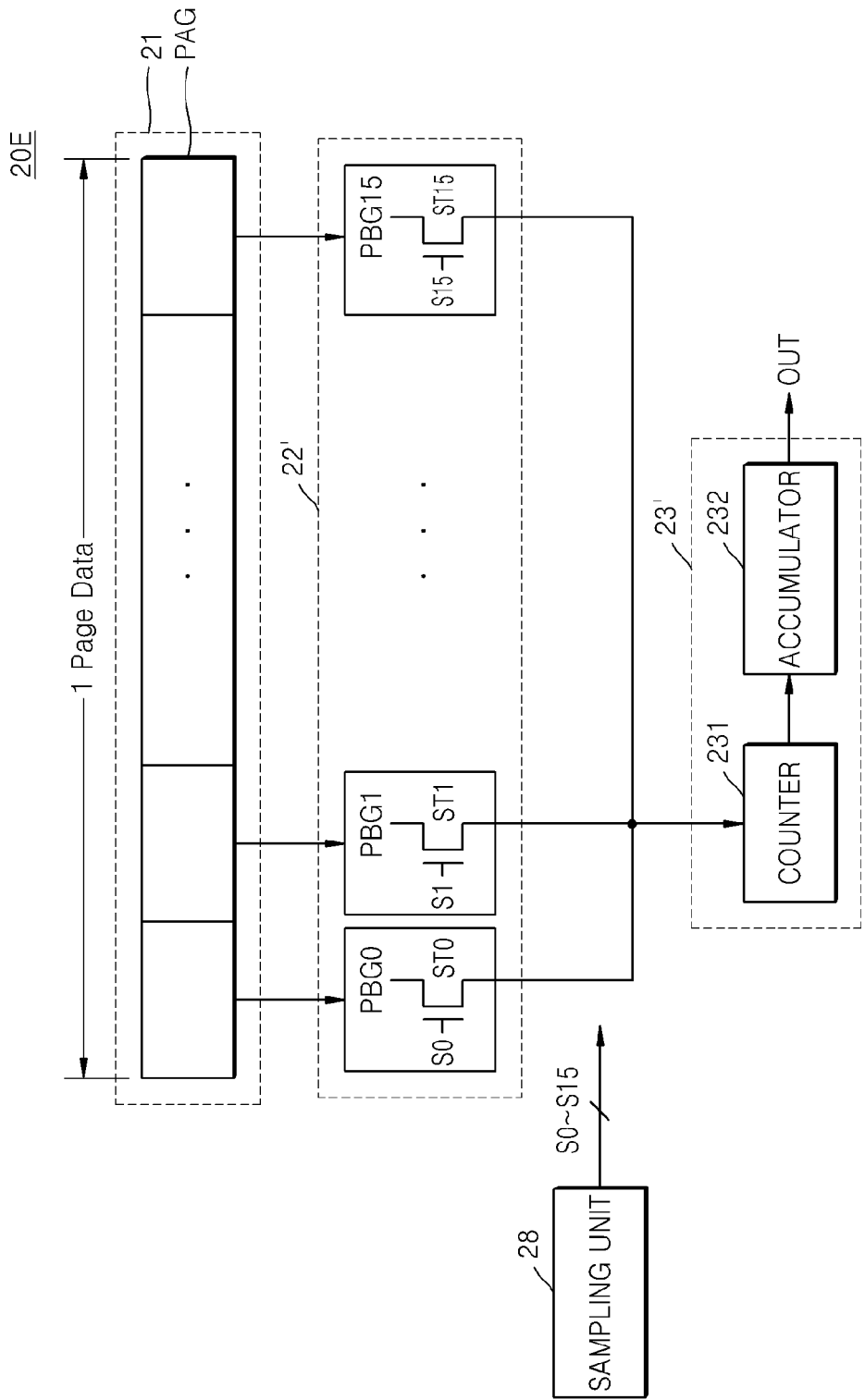
FIG. 29 is a block diagram of the memory device of FIG. 28.

FIG. 29 is a block diagram of the memory device 20E of FIG. 28.

Referring to FIG. 29, the memory device 20E may include the memory cell array 21, the page buffer unit 22', the counting unit 23', and the sampling unit 28. The counting unit 23' may include a counter 231 and a plurality of accumulators 232.

The memory cell array 21 may include a page PAG. The page PAG may include a plurality of memory cells. Also, the plurality of memory cells included in the page PAG may be divided into a plurality of groups. For example, the plurality of memory cells included in the page PAG may be divided into 16 groups. For convenience, FIG. 29 illustrates a case in which the memory cell array 21 includes one page PAG, but the memory cell array 21 may include a plurality of pages.

The page buffer unit 22' may include a plurality of page buffer groups PBG0, PBG1, ..., PBG15. Each of the plurality of page buffer groups PBG0, PBG1, ..., PBG15 may include a plurality of page buffers (not shown). The plurality of page buffers may be connected to memory cells via corresponding bitlines (not shown), respectively. The plurality of page buffers may temporarily store data to be written to the memory cell array 21 or data read from the memory cell array 21.

The plurality of groups included in the page PAG may be connected to the plurality of page buffer groups PBG0, PBG1, ..., PBG15, respectively. In the present embodiment, the page PAG may include memory cells corresponding to 8 KB and may be divided into 16 groups, and in this regard, each of the 16 groups may include memory cells that correspond to 500B.

The plurality of page buffer groups PBG0, PBG1, ..., PBG15 may include selection transistors ST0, ST1, ..., ST15, respectively. In more detail, the selection transistors ST0, ST1, ..., ST15 may be formed as NMOS transistors having drains that receive output signals of the plurality of page buffer groups PBG0, PBG1, ..., PBG15, respectively, sources that are connected to the counter 231, and gates to which selection signals S0, S1, ..., S15 output from the sampling unit 28 are applied. In the present embodiment, each of the plurality of page buffer groups PBG0, PBG1, ..., PBG15 may include one selection transistor. In another embodiment, each of the plurality of page buffer groups PBG0, PBG1, ..., PBG15 may include selection transistors that correspond to the number of page buffers included in each of the plurality of page buffer groups PBG0, PBG1, ..., PBG15.

The sampling unit 28 may output the selection signals S0, S1, ..., S15 to select at least one of the plurality of page buffer groups PBG0, PBG1, ..., PBG15. When the first selection signal S0 from among the selection signals S0, S1, ..., S15 is activated, an output from the first page buffer group PBG0 may be input to the counter 231, when a second selection signal S1 from among the selection signals S0, S1, ..., S15 is activated, an output from a second page buffer group PBG1 may be input to the counter 231, and when a $16^{th}$ selection signal S15 from among the selection signals S0, S1, ..., S15 is activated, an output from a $16^{th}$ page buffer group PBG15 may be input to the counter 231. Here, the selection signals S0, S1, ..., S15 may be sequentially activated.

The counter 231 receives an output from a page buffer group from among the plurality of page buffer groups PBG0, PBG1, ..., PBG15 included in the page buffer unit 22', wherein the page buffer group is selected by the sampling unit 28, and thus performs a counting operation. In more detail, the counter 231 may count the number of memory cells that exist in each of a plurality of sections based on a result of a logic operation output from a page buffer group that is selected by the sampling unit 28. Here, the counter 231 may be formed as an analog counter.

The number of the plurality of accumulators 232 may correspond to the number of the plurality of page buffer groups PBG0, PBG1, ..., PBG15. The plurality of accumulators 232 may accumulate outputs from the counter 231 which correspond to the plurality of page buffer groups PBG0, PBG1, ..., PBG15, respectively.

Figure 30A:
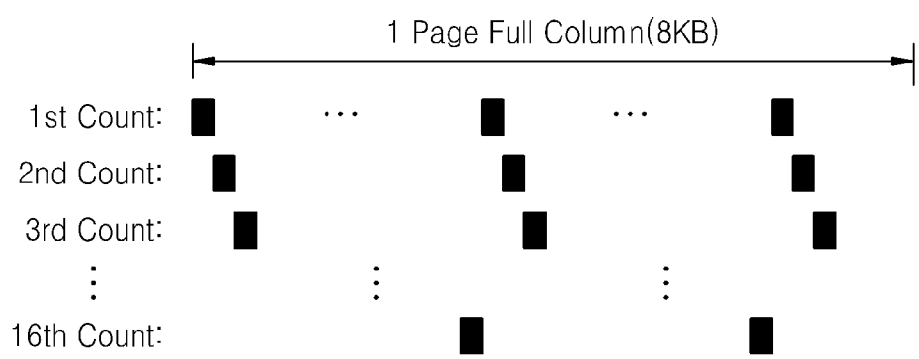
FIG. 30A is a diagram for use in explaining an operation of the memory device when a sampling unit of FIG. 28 does not perform a sampling operation.

FIG. 30A illustrates an operation of the memory device 20E when the sampling unit 28 of FIG. 28 does not perform a sampling operation.

Referring to FIG. 30A, when the sampling unit 28 does not perform the sampling operation, the sampling unit 28 may control the page buffer unit 22' to perform an MES operation on all of the columns of one page (i.e., 1 Page Full Columns) which corresponds to 8 KB.

In more detail, the sampling unit 28 may sequentially activate all of the selection signals S0, S1, ..., S15 and may output them to the page buffer unit 22'. By doing so, the outputs from the plurality of page buffer groups PBG0, PBG1, ..., PBG15 may be sequentially input to and counted by the counter 231, and then the plurality of accumulators 232 may store the counting results.

When the first selection signal S0 is activated, the output from the first page buffer group PBG0 which corresponds to the memory cells of the first group is counted by the counter 231, and a result of the count is stored in the corresponding accumulator 232. Then, when the second selection signal S1 is activated, the output from the second page buffer group PBG1 which corresponds to the memory cells of the second group is counted by the counter 231, and a result of the count is stored in the corresponding accumulator 232. While the aforementioned operation is repeated, when the $16^{th}$ selection signal S15 is activated, the output from the $16^{th}$ page buffer group PBG15 which corresponds to the memory cells of the $16^{th}$ group is counted by the counter 231, and a result of the count is stored in the corresponding accumulator 232.

Figure 30B:
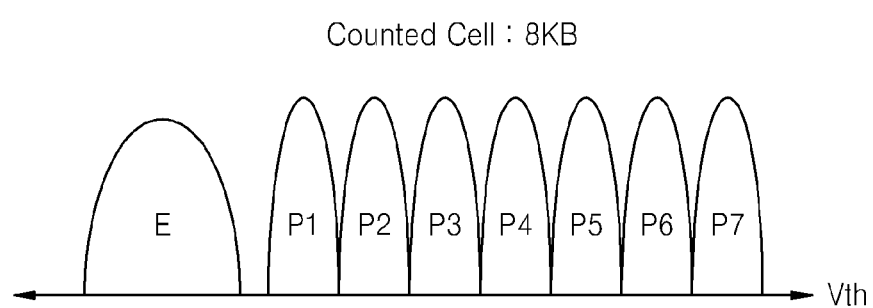
FIG. 30B is a graph illustrating a distribution of the memory cells according to FIG. 30A.

FIG. 30B is a graph illustrating a distribution of the memory cells according to FIG. 30A.

Referring to FIG. 30B, when the sampling unit 28 does not perform the sampling operation, an MES operation is performed on all of the memory cells included in one page corresponding to 8 KB, so that the distribution of the memory cells versus threshold voltages, as illustrated in FIG. 30B, may be obtained.

Figure 31A:
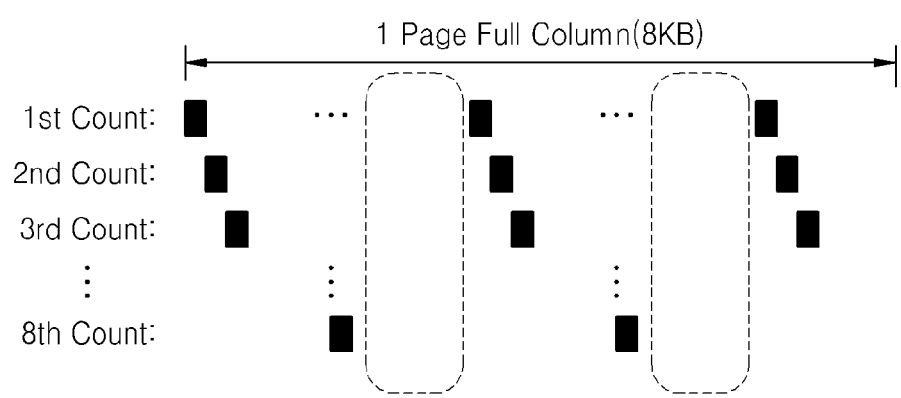
FIG. 31A is a diagram for use in explaining an operation of the memory device when the sampling unit of FIG. 28 performs a sampling operation.

FIG. 31A illustrates an operation of the memory device 20E when the sampling unit 28 of FIG. 28 performs a sampling operation.

Referring to FIG. 31A, when the sampling unit 28 performs the sampling operation, the sampling unit 28 may control the page buffer unit 22' to perform an MES operation on some of the columns of one page corresponding to 8 KB. For example, the sampling unit 28 may control the page buffer unit 22' to perform the MES operation on half of the columns of one page.

In more detail, the sampling unit 28 may sequentially activate the first through eighth selection signals S0, S1, . . . , S7 from among the plurality of selection signals S0, S1, . . . , S15 and then may output them to the page buffer unit 22'. By doing so, the outputs from the first through eighth page buffer groups PBG0, PBG1, . . . , PBG7 from among the plurality of page buffer groups PBG0, PBG1, . . . , PBG15 may be sequentially input to and counted by the counter 231, and then the plurality of accumulators 232 may store the counting results.

In this manner, the sampling unit 28 may control the page buffer unit 22' to perform sampling only on some of the memory cells included in one page. In the present embodiment, the sampling unit 28 performs sampling on 4 KB of the page corresponding to 8 KB but aspects of the inventive concept are not limited thereto. In another embodiment, the sampling unit 28 may perform sampling on 2 KB or 1 KB of the page corresponding to 8 KB, and the number of the memory cells to be sampled may vary according to settings by a user.

Figure 31B:
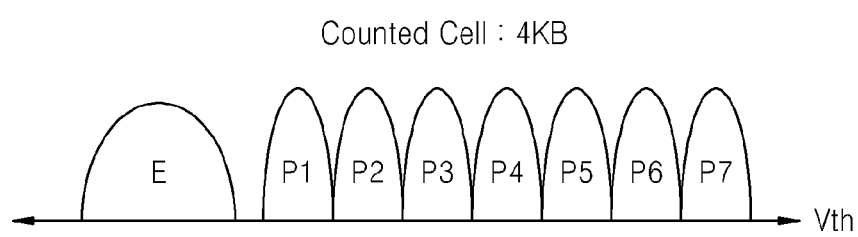
FIG. 31B is a graph illustrating a distribution of the memory cells according to FIG. 31A.

FIG. 31B is a graph illustrating a distribution of the memory cells according to FIG. 31A.

Referring to FIG. 31B, when the sampling unit 28 performs the sampling operation, an MES operation is performed on half of the memory cells included in one page corresponding to 8 KB, so that the distribution of the memory cells versus threshold voltages, as illustrated in FIG. 31B, may be obtained. Compared to the graph of FIG. 30B, the graph of FIG. 31B has a height that is reduced by half, but the distribution of the memory cells are similar. Thus, a voltage level corresponding to valleys to be detected may be the same in both the graph of FIG. 30B and the graph of FIG. 31B.

As described above, according to the present embodiment, the counting unit 23' may time-sequentially perform 16 counting operations. In a case where the number of programming/erasing cycles is not great, so that distribution deterioration is not significant, in order to reduce a time taken in a counting operation, the sampling unit 28 provides the selection signals S0, S1, . . . , S15 to the page buffer unit 22' so as to allow only some of the 16 counting operations to be performed by the counting unit 23'. By doing so, outputs from only some of the plurality of page buffer groups PBG0, PBG1, . . . , PBG15 may be selectively provided to the counting unit 23'.

FIG. 32 is a flowchart illustrating a method of controlling a read voltage, performed by a memory device, according to an embodiment of the inventive concept.

Referring to FIG. 32, the method according to the present embodiment controls a read voltage to read data stored in a memory cell array that is included in the memory device. The aforementioned descriptions regarding the previously described memory systems 1, 2, 3, 4 and 5 also apply to the method of controlling the read voltage.

In operation S110, a plurality of pieces of data are sequentially read from some of a plurality of memory cells at different voltage levels.

In operation S120, a logic operation is performed on the plurality of pieces of data.

In operation S130, based on results of the logic operation, the number of the memory cells that exist in each of a plurality of sections defined by the different voltage levels is counted.

In operation S140, based on the number of the counted memory cells, an optimal voltage level of a read voltage between two adjacent states of the memory cells is determined.

Figure 33:
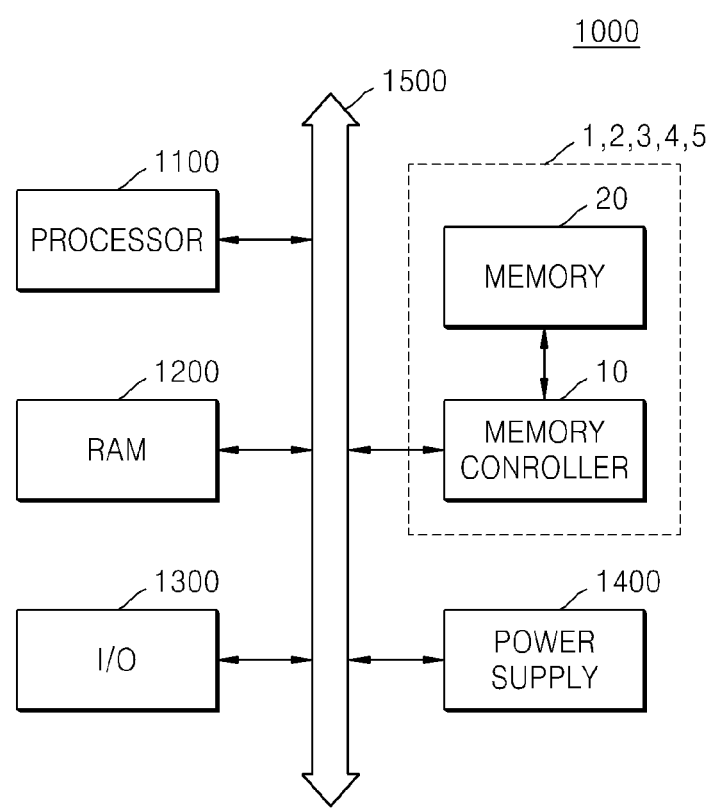
FIG. 33 is a block diagram of a computing system including a memory systems according to an embodiment of the inventive concept.

FIG. 33 is a block diagram of a computing system 1000 including a previously described memory system 1, 2, 3, 4 or 5, according to an embodiment of the inventive concept.

Referring to FIG. 33, the computing system 1000 may include a processor 1100, a RAM 1200, an input/output device 1300, a power supply device 1400, and the memory system containing a memory device 20 and memory controller 10. Although not illustrated in FIG. 33, the computing system 1000 may further include ports that may communicate with video cards, sound cards, memory cards, universal serial bus (USB) devices, or other electronic devices. The computing system 1000 may be implemented as a personal computer (PC), or a portable electronic device, such as a notebook computer, a mobile phone, a personal digital assistant (PDA), a camera, or the like.

The processor 1100 may perform predetermined calculations or tasks. In one embodiment, the processor 1100 may be a micro-processor or a central processing unit (CPU). The processor 1100 may perform communication with the RAM 1200, the input/output device 1300, and the memory system via an address bus, a control bus, a data bus, or the like.

In one embodiment, the processor 1100 may be connected to an extension type computer bus, such as a Peripheral Component Interconnect (PCI) bus.

The RAM 1200 may store data required for an operation of the computing system 1000. For example, the RAM 1200 may be implemented with a DRAM, a mobile DRAM, an SRAM, a PRAM, an FRAM, an RRAM and/or an MRAM.

The input/output device 1300 may include an input unit, such as a keyboard, a keypad, a mouse, or the like, and an output unit, such as a printer, a display, or the like. The power supply device 1400 may supply operating voltages required for the operation of the computing system 1000.

Although not illustrated, the memory system may be provided as a storage device of an information processing apparatus, which is combined with an application chipset, a camera image processor, or a mobile DRAM and thus exchanges a large amount of data.

The memory devices 20A, 20B, 20C, 20D, and 20E, and the memory systems 1, 2, 3, 4, and 5 according to the embodiments of the inventive concept may be mounted according any of a variety of packaging technologies. For example, one or more of the memory devices 20A, 20B, 20C, 20D, and 20E and the memory system 1 may be mounted by using packages such as a Package on Package (PoP), Ball grid arrays (BGAs), Chip scale packages (CSPs), a Plastic Leaded Chip Carrier (PLCC), a Plastic Dual In-Line Package (PDIP), a Die in a Waffle Pack, a Die in a Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi-Chip Package (MCP), a Wafer-level Fabricated Package (WFP), a Wafer-Level Processed Stack Package (WSP), and the like.

While the inventive concept has been particularly shown and described with reference to exemplary embodiments thereof, it will be understood that various changes in form and details may be made therein without departing from the spirit and scope of the following claims.

What is claimed is:

1. A memory device comprising:
    a memory cell array comprising a plurality of memory cells;
    a page buffer unit comprising a plurality of page buffers, each of the plurality of page buffers configured to store a plurality of pieces of data sequentially read at different read voltages from a memory cell among the plurality of memory cells, and each configured to perform a logic operation on the plurality of pieces of data stored therein and to output a corresponding logic result;
    a counting unit configured to count a number of memory cells read by the plurality of page buffers that exist in each of a plurality of sections defined by the different read voltage levels, based on results of the logic operation output by each of the page buffers; and
    a valley detecting unit configured to detect a read voltage level that corresponds to a valley between two adjacent states of the memory cells based on the number of the memory cells counted by the counting unit.

2. The memory device of claim 1, wherein the logic operation is an XOR operation, and each of the plurality of page buffers performs the XOR operation on two pieces of data which are respectively read at two read voltage levels that are adjacent to each other from among the different read voltage levels, and
    the counting unit counts the number of '1' outcomes resulting from the XOR operation with respect to each of the plurality of sections.

3. The memory device of claim 1, wherein the counting unit comprises counters corresponding to a number of sectors or pages of the memory cell array on which a read operation is performed.

4. The memory device of claim 1, wherein the different read voltage levels are automatically updated in the memory device.

5. The memory device of claim 1, further comprising a voltage level determining unit configured to determine the different read voltage levels applied to the memory cell array.

6. The memory device of claim 5, wherein the voltage level determining unit comprises:
    a start voltage storage unit configured to store a start read voltage that is applied to the memory cell array;
    an offset storage unit configured to store a plurality of offset voltages that are pre-defined; and
    an adding unit configured to add one of the plurality of offset voltages to the start read voltage.

7. The memory device of claim 6, wherein the start voltage storage unit stores a digital value of the start read voltage,
    the offset storage unit stores digital values of the plurality of offset voltages, and
    the voltage level determining unit further comprises a voltage level generating unit configured to generate an analog voltage level from an output of the adding unit.

8. The memory device of claim 6, wherein the start read voltage is determined to vary with respect to different memory chips.

9. The memory device of claim 6, wherein the plurality of offset voltages are determined to be the same with respect to different memory chips.

10. The memory device of claim 1, wherein the valley detecting unit comprises:
    a minimum value storage unit configured to store a minimum value of the numbers of the memory cells that exist in each of the plurality of sections; and
    a minimum offset storage unit configured to store an offset as a minimum offset, wherein the offset corresponds to a section that is from among the plurality of sections and that has the minimum value.

11. The memory device of claim 10, wherein the valley detecting unit further comprises a valley storage unit configured to store a read voltage level corresponding to the valley based on the minimum offset stored in the minimum offset storage unit.

12. The memory device of claim 11, wherein the valley storage unit comprises a plurality of valley storage devices, and
    the number of the plurality of valley storage devices corresponds to the number of valleys between the two adjacent states of the memory cells.

13. The memory device of claim 1, further comprising a read voltage generating unit configured to provide the memory cell array with a read voltage level corresponding to the valley detected by the valley detecting unit.

14. The memory device of claim 13, wherein the read voltage generating unit comprises:
    an initial read voltage storage unit configured to store a plurality of initial read voltages that respectively correspond to valleys between two adjacent states from among a plurality of states of the memory cells;
    an offset storage unit configured to store a plurality of offsets that correspond to the valleys, respectively; and
    an adding unit configured to add one of the plurality of offsets to one of the plurality of initial read voltages.

15. The memory device of claim 14, wherein the read voltage generating unit further comprises:
    a first control unit configured to control the initial read voltage storage unit to select one of the plurality of initial read voltages stored in the initial read voltage storage unit; and
    a second control unit configured to control the offset storage unit to use one of the plurality of offsets stored in the offset storage unit so as to generate a read voltage.

16. The memory device of claim 14, wherein the initial read voltage storage unit stores digital values of the plurality of initial read voltages, the offset storage unit stores digital values of the plurality of offsets, and
    the read voltage generating unit further comprises a voltage level generating unit configured to generate an analog voltage level from an output from the adding unit.

17. The memory device of claim 1, further comprising a pre-charge determining unit configured to determine whether to pre-charge at least one bitline connected to at least one memory cell from among the plurality of memory cells,
    wherein the at least one memory cell is a memory cell of which a read voltage is already determined or is a memory cell of which the read voltage is not required to be detected.

18. The memory device of claim 1, further comprising a sampling unit configured to control the page buffer unit to perform sampling on at least one memory cell from among the plurality of memory cells and to perform an operation to determine a read voltage based on the sampled at least one memory cell.

19. A memory device, comprising:
a memory cell array comprising a plurality of bit lines and word lines, and a plurality of memory cells located at intersections of the bit lines and word lines, each of the memory cells programmable between at least 2 threshold voltage states;
a read voltage generator configured to apply a read voltage to selected word lines of the memory cell array;
a page buffer unit comprising a plurality of page buffers respectively connected to the bit lines of the memory cell array;
a counter; and
a logic circuit configured to execute a minimal error search (MES) operation, the MES operation including controlling the read voltage generator to sequentially apply different read voltages to the selected word lines, controlling the page buffers to perform logic operations on respective read results stored for each of a plurality of memory cells, the read results respectively corresponding to at least two of the sequentially applied different read voltages, and controlling the counter to count results of the logic operations,
wherein the different read voltages are in a vicinity between adjacent threshold voltages of adjacent threshold voltage states, and wherein the count results are indicative of a read voltage resulting in a minimal read error between the adjacent threshold states.

20. The memory device of claim 19, wherein the count results are output to an external device.

21. The memory device of claim 19, further comprising a valley detecting unit configured to determine the read voltage resulting in the minimal read error between the adjacent threshold states.

22. The memory device of claim 19, wherein a count result is obtained for each bit line of the memory cell array.

23. The memory device of claim 19, wherein memory cells of each word line are divided into a plurality of sectors, and a count result is obtained for each sector of the memory cell array.

24. A memory system comprising a memory device and a memory controller for controlling the memory device, wherein the memory device comprises:
a memory cell array comprising a plurality of memory cells;
a page buffer unit comprising a plurality of page buffers, each of the plurality of page buffers configured to store a plurality of pieces of data sequentially read at different read voltages from a memory cell among the plurality of memory cells, and each configured to perform a logic operation on the plurality of pieces of data stored therein and to output a corresponding logic result;
a counting unit configured to count a number of memory cells read by the plurality of page buffers that exist in each of a plurality of sections defined by the different read voltage levels, based on results of the logic operation output by each of the page buffers; and
a valley detecting unit configured to detect a read voltage level that corresponds to a valley between two adjacent states of the memory cells based on the number of the memory cells counted by the counting unit, and
wherein the memory device provides the memory controller with the read voltage level corresponding to the detected valley.

25. The memory system of claim 24, wherein the memory device provides the memory controller with the number of the counted memory cells.

26. The memory system of claim 24, wherein the memory device further comprises a voltage level determining unit configured to determine the different voltage levels applied to the memory cell array.

27. A memory system comprising a memory device and a memory controller for controlling the memory device, wherein the memory device comprises:
a memory cell array comprising a plurality of memory cells;
a page buffer unit comprising a plurality of page buffers, each of the plurality of page buffers configured to store a plurality of pieces of data sequentially read at different read voltages from a memory cell among the plurality of memory cells, and each configured to perform a logic operation on the plurality of pieces of data stored therein and to output a corresponding logic result;
a counting unit configured to count a number of memory cells read by the plurality of page buffers that exist in each of a plurality of sections defined by the different read voltage levels, based on results of the logic operation output by each of the page buffers; and
a read voltage generating unit configured to determine a voltage level as a read voltage which corresponds to a valley between two adjacent states of the memory cells based on the number of the counted memory cells, and providing the read voltage to the memory cell array.

28. A method of controlling a read voltage of a memory device, the memory device configured to operate under control of a memory controller, the method comprising:
sequentially reading, from each of a plurality of memory cells in the memory device, a plurality of pieces of data at respectively different voltage levels;
storing, for each of the plurality of memory cells, the plurality of pieces of data read at the respectively different voltage levels;
performing, in the memory device and for each of the plurality of memory cells, a logic operation on the plurality of pieces of data stored for each of the plurality of memory cells;
counting, in the memory device, the number of memory cells that exist in each of a plurality of sections defined by the different voltage levels, based on results of the logic operation performed for each of the plurality of memory cells; and
determining, in the memory device, an optimal voltage level of a read voltage between two adjacent states of the memory cells, based on the number of the counted memory cells.

* * * * *